(12) United States Patent
Lai et al.

(10) Patent No.: US 9,354,521 B2
(45) Date of Patent: May 31, 2016

(54) PHOTORESIST SYSTEM AND METHOD

(71) Applicant: Taiwan Semiconductor Manufacturing Company, Ltd., Hsin-Chu (TW)

(72) Inventors: Wei-Han Lai, New Taipei (TW); Ching-Yu Chang, Yilang County (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/906,787

(22) Filed: May 31, 2013

(65) Prior Publication Data

US 2014/0272716 A1 Sep. 18, 2014

Related U.S. Application Data

(60) Provisional application No. 61/777,925, filed on Mar. 12, 2013.

(51) Int. Cl.
| G03F 7/26 | (2006.01) |
| G03F 7/38 | (2006.01) |
| G03F 7/40 | (2006.01) |
| G03F 7/004 | (2006.01) |
| G03F 7/039 | (2006.01) |
| G03F 7/20 | (2006.01) |

(52) U.S. Cl.
CPC .............. G03F 7/38 (2013.01); G03F 7/0045 (2013.01); G03F 7/0046 (2013.01); G03F 7/0397 (2013.01); G03F 7/2041 (2013.01); G03F 7/26 (2013.01); G03F 7/40 (2013.01)

(58) Field of Classification Search
CPC .............. G03F 7/38; G03F 7/40; G03F 7/26
USPC .............. 430/311, 313, 325, 326, 330
See application file for complete search history.

(56) References Cited

U.S. PATENT DOCUMENTS

| 4,072,527 A | 2/1978 | Fan |
| 4,212,935 A | 7/1980 | Canavello et al. |
| 4,268,601 A | 5/1981 | Namiki et al. |
| 4,289,845 A | 9/1981 | Bowden et al. |
| 4,346,164 A | 8/1982 | Tabarelli et al. |
| 4,491,628 A | 1/1985 | Ito et al. |
| 4,663,275 A | 5/1987 | West et al. |
| 4,743,529 A * | 5/1988 | Farid et al. ............ 430/281.1 |
| 4,777,119 A | 10/1988 | Brault et al. |
| 4,939,070 A | 7/1990 | Brunsvold et al. |
| 5,002,850 A | 3/1991 | Shinozaki et al. |
| 5,268,260 A | 12/1993 | Bantu et al. |
| 5,288,588 A | 2/1994 | Yukawa et al. |
| 5,738,975 A | 4/1998 | Nakano et al. |
| 5,750,312 A | 5/1998 | Chandross et al. |
| 5,766,824 A | 6/1998 | Batchelder et al. |
| 5,856,065 A | 1/1999 | Hagen |
| 5,863,710 A | 1/1999 | Wakiya et al. |
| 5,886,102 A | 3/1999 | Sinta et al. |
| 5,889,141 A | 3/1999 | Marrocco, III et al. |
| 6,008,265 A | 12/1999 | Vallee et al. |
| 6,147,249 A | 11/2000 | Watanabe et al. |
| 6,187,504 B1 | 2/2001 | Suwa et al. |
| 6,306,554 B1 | 10/2001 | Barclay et al. |
| 6,627,377 B1 | 9/2003 | Itatani et al. |
| 6,787,289 B2 | 9/2004 | Yamada et al. |
| 6,788,477 B2 | 9/2004 | Lin |
| 6,790,579 B1 | 9/2004 | Goodall et al. |
| 6,835,527 B2 | 12/2004 | Takata et al. |
| 6,852,473 B2 | 2/2005 | Roberts et al. |
| 6,872,503 B2 | 3/2005 | Wheland et al. |
| 6,875,554 B2 | 4/2005 | Hatanaka et al. |
| 6,936,400 B2 | 8/2005 | Takasu et al. |
| 6,952,253 B2 | 10/2005 | Lof et al. |
| 6,991,888 B2 | 1/2006 | Padmanaban et al. |
| 7,195,860 B2 | 3/2007 | Endo et al. |
| 7,235,348 B2 | 6/2007 | Ho et al. |
| 7,264,918 B2 | 9/2007 | Endo et al. |
| 7,312,014 B2 | 12/2007 | Maesawa et al. |
| 7,320,855 B2 | 1/2008 | Huang et al. |
| 7,344,970 B2 | 3/2008 | Forman et al. |
| 7,362,412 B2 | 4/2008 | Holmes et al. |
| 7,393,624 B2 | 7/2008 | Allen et al. |
| 7,432,035 B2 | 10/2008 | Maeda et al. |
| 7,432,042 B2 | 10/2008 | Chang et al. |

(Continued)

FOREIGN PATENT DOCUMENTS

| EP | 1500977 | 1/2005 |
| JP | 2006145788 | 6/2006 |

(Continued)

OTHER PUBLICATIONS

Sekiguchi et al., "Analysis of Deprotection Reaction in Chemically Amplified Resists Using an Fourier Transform Infrared Spectrometer with an Exposure Tool," Jpn. J. Appl. Phys., vol. 39, pp. 1392-1398, Part 1, No. 3A, Mar. 2000.

Hoo, Ng Wah et al., "The Effect of UPW Quality on Photolithography Defect," Proc. SPIE 7520, Lithography Asia 2009, Dec. 14, 2009, 7 pages, vol. 7520, SPIE, Taipei, Taiwan.

Kitano, Junichi et al., "Resist pattern collapse prevention for the sub-90nm node," Microlithography World, May 2004, pp. 18-24, PennWell Publishing Corp.

Kunz, Roderick R., Kunz SPIE Short Course, 21 pages, MIT Lincoln Library, 2002, publisher unknown.

Lau, Aldrich N. K. et al., "New Thermal Cross-Linkers Based on Triazene: Cross-Linking of Fluorinated Polyimides and Aromatic Polymers," Macromolecules, 1992, pp. 7294-7299, vol. 25.

Reiser, Arnost, Photoreactive Polymers: The Science and Technology of Resists, Feb. 1989, 409 pages, Wiley-Interscience, New York.

Robertson, Stewart et al., "Physical Resist Simulation for a Negative Tone Development Process," 2010 International Symposium on Lithography Extension, Oct. 20-22, 2010, 19 pages.

(Continued)

*Primary Examiner* — John S Chu

(74) *Attorney, Agent, or Firm* — Slater Matsil, LLP

(57) ABSTRACT

A system and method for photoresists is provided. In an embodiment the photoresist is exposed in a photoresist track system and developed in an offline developing system. After the photoresist is exposed, the photoresist may be idled for a time period prior to being developed in the offline developing system.

20 Claims, 11 Drawing Sheets

(56) References Cited

U.S. PATENT DOCUMENTS

| | | |
|---|---|---|
| 7,460,206 B2 | 12/2008 | Weissenrieder et al. |
| 7,470,503 B1 | 12/2008 | Brandl |
| 7,582,398 B2 | 9/2009 | Iftime et al. |
| 7,585,612 B2 | 9/2009 | Thackeray et al. |
| 7,595,141 B2 | 9/2009 | Kudo et al. |
| 7,608,386 B2 | 10/2009 | Nozaki et al. |
| 7,648,815 B2 | 1/2010 | Itatani et al. |
| 7,718,541 B2 | 5/2010 | Makiyama et al. |
| 7,733,459 B2 | 6/2010 | Dierichs et al. |
| 7,738,074 B2 | 6/2010 | Streefkerk et al. |
| 7,779,781 B2 | 8/2010 | Mertens et al. |
| 7,824,837 B2 | 11/2010 | Wu et al. |
| 7,846,637 B2 | 12/2010 | Ishizuka et al. |
| 7,879,529 B2 | 2/2011 | Endo et al. |
| 7,919,222 B2 | 4/2011 | Vohra et al. |
| 7,959,141 B2 | 6/2011 | Makino |
| 7,985,534 B2 | 7/2011 | Tsubaki |
| 7,989,578 B2 | 8/2011 | Wu |
| 7,998,655 B2 | 8/2011 | Tsubaki |
| 8,017,304 B2 | 9/2011 | Tarutani et al. |
| 8,071,272 B2 | 12/2011 | Tsubaki |
| 8,088,548 B2 | 1/2012 | Houlihan et al. |
| 8,088,557 B2 | 1/2012 | Tsubaki |
| 8,105,748 B2 | 1/2012 | Ohashi et al. |
| 8,257,901 B2 | 9/2012 | Kim et al. |
| 8,323,870 B2 | 12/2012 | Lee et al. |
| 8,329,387 B2 | 12/2012 | Yao et al. |
| 8,334,338 B2 | 12/2012 | Yoshimura et al. |
| 8,460,856 B2 | 6/2013 | Yeh et al. |
| 8,507,177 B2 | 8/2013 | Wang et al. |
| 8,518,628 B2 | 8/2013 | Chang et al. |
| 8,586,290 B2 | 11/2013 | Wang et al. |
| 2001/0044070 A1 | 11/2001 | Uetani et al. |
| 2002/0015826 A1 | 2/2002 | Desmarteau et al. |
| 2002/0051933 A1 | 5/2002 | Kodama et al. |
| 2002/0068237 A1 | 6/2002 | Imai |
| 2003/0022097 A1 | 1/2003 | Malik et al. |
| 2003/0073027 A1 | 4/2003 | Namiki et al. |
| 2003/0079764 A1 | 5/2003 | Hirose et al. |
| 2003/0087179 A1 | 5/2003 | Iwasaki |
| 2003/0175624 A1 | 9/2003 | Nozaki et al. |
| 2004/0084150 A1 | 5/2004 | George et al. |
| 2004/0096780 A1 | 5/2004 | Nozaki et al. |
| 2004/0161698 A1 | 8/2004 | Kanagasabapathy et al. |
| 2004/0180299 A1 | 9/2004 | Rolland et al. |
| 2005/0134817 A1 | 6/2005 | Nakamura |
| 2005/0145803 A1 | 7/2005 | Hakey et al. |
| 2005/0145821 A1 | 7/2005 | French et al. |
| 2005/0225737 A1 | 10/2005 | Weissenrieder et al. |
| 2005/0266354 A1 | 12/2005 | Li et al. |
| 2005/0287466 A1 | 12/2005 | Miyamoto et al. |
| 2006/0008736 A1 | 1/2006 | Kanda et al. |
| 2006/0105267 A1 | 5/2006 | Khojasteh et al. |
| 2006/0141400 A1 | 6/2006 | Hirayama et al. |
| 2006/0204890 A1 | 9/2006 | Kodama |
| 2006/0246373 A1 | 11/2006 | Wang |
| 2006/0257781 A1 | 11/2006 | Benoit et al. |
| 2006/0257785 A1 | 11/2006 | Johnson |
| 2007/0031755 A1 | 2/2007 | Hirayama et al. |
| 2007/0207406 A1 | 9/2007 | Guerrero et al. |
| 2008/0113300 A2 | 5/2008 | Choi et al. |
| 2008/0149135 A1 | 6/2008 | Cho et al. |
| 2008/0160729 A1 | 7/2008 | Krueger et al. |
| 2008/0187860 A1 | 8/2008 | Tsubaki et al. |
| 2008/0241778 A1 | 10/2008 | Kulp |
| 2009/0042147 A1 | 2/2009 | Tsubaki |
| 2009/0305163 A1 | 12/2009 | Iwashita et al. |
| 2009/0311624 A1 | 12/2009 | Horiguchi et al. |
| 2010/0040971 A1 | 2/2010 | Tarutani et al. |
| 2010/0216077 A1* | 8/2010 | Nishi et al. .......... 430/325 |
| 2010/0239984 A1 | 9/2010 | Tsubaki |
| 2011/0020755 A1 | 1/2011 | Tsubaki |
| 2011/0097670 A1 | 4/2011 | Wang et al. |
| 2011/0250543 A1 | 10/2011 | Tsubaki |
| 2011/0263136 A1 | 10/2011 | Kim et al. |
| 2012/0052687 A1 | 3/2012 | Raghavan et al. |
| 2012/0171616 A1 | 7/2012 | Thackeray et al. |
| 2012/0238106 A1 | 9/2012 | Chuang |
| 2012/0282553 A1 | 11/2012 | Kimura et al. |
| 2012/0308741 A1 | 12/2012 | Kim et al. |
| 2012/0308939 A1 | 12/2012 | Kudo et al. |
| 2014/0011133 A1 | 1/2014 | Liu et al. |

FOREIGN PATENT DOCUMENTS

| | | |
|---|---|---|
| TW | 1336819 | 2/2011 |
| TW | 1341961 | 5/2011 |
| TW | 11343513 | 6/2011 |
| WO | 2005088397 | 9/2005 |
| WO | 2006054432 | 5/2006 |

OTHER PUBLICATIONS

Switkes, M. et al., "Extending optics to 50 nm and beyond with immersion lithography," Journal of Vacuum Science & Technology B: Microelectronics and Nanometer Structures, Nov./Dec. 2003, vol. 21, No. 6., pp. 2794-2799.

Tarutani, Shinji et al., "Process parameter influence to negative tone development process for double patterning," Proc. SPIE 7639, Advances in Resist Materials and Processing Technology XXVII, Mar. 29, 2010, 13 pages, vol. 7639.

Tsvetanova, D. et al., "Degradation of 248 nm Deep UV Photoresist by Ion Implantation," Journal of the Electromechanical Society, Jun. 10, 2011, 10 pages, vol. 158, Issue 8, The Electromechanical Society.

* cited by examiner

PHOTORESIST SYSTEM AND METHOD

This application claims the benefit of U.S. Provisional Application No. 61/777,925, filed Mar. 12, 2013, and entitled "Photoresist System and Method," which application is hereby incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface and then exposed to an energy that has itself been patterned. Such an exposure modifies the chemical and physical properties of the exposed regions of the photolithographic material. This modification, along with the lack of modification in regions of the photolithographic material that were not exposed, can be exploited to remove one region without removing the other.

However, as the size of individual devices has decreased, process windows for photolithographic processing as become tighter and tighter. As such, advances in the field of photolithographic processing have been necessitated in order to keep up the ability to scale down the devices, and further improvements are needed in order to meet the desired design criteria such that the march towards smaller and smaller components may be maintained.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a photoresist process utilized in the manufacturing of semiconductor devices. Other embodiments may also be applied, however, to other manufacturing processes.

Figure 1:
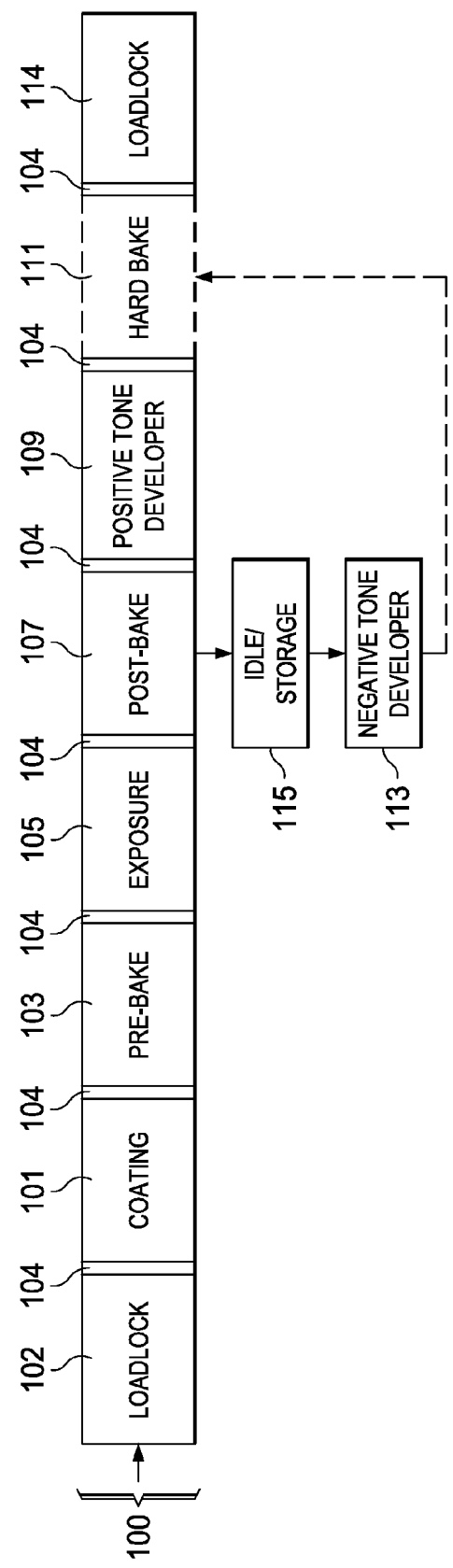
FIG. 1 illustrates a photoresist track system in accordance with an embodiment.

With reference now to FIG. 1, there is shown a first photoresist track system 100 with a first loadlock chamber 102, a coating station 101, a pre-bake station 103, an exposure station 105, a post-bake station 107, a positive tone developer station 109, an optional first hard bake station 111, a number of transfer stations 104, and a second loadlock chamber 114. In an embodiment the first photoresist track system 100 is a track system for processing a substrate 201 (not illustrated in FIG. 1 but illustrated and discussed below with respect to FIG. 2B), and is a self-enclosed, fully contained system into which the substrate 201 may be initially placed. Once within the first photoresist track system 100, the substrate 201 may be moved from station to station and processed without breaking the interior environment, thereby isolating the substrate 201 from the ambient environment that may contaminate or otherwise interfere with the processing of the substrate 201.

In an embodiment the first photoresist track system 100 receives the semiconductor substrate into the first photoresist track system 100 through, e.g., the first loadlock chamber 102. The first loadlock chamber 102 opens to the exterior atmosphere and receives the substrate 201. Once the substrate 201 is located within the first loadlock chamber 102, the first loadlock chamber 102 can close, isolating the substrate 201 from the exterior atmosphere. Once isolated, the first loadlock chamber 102 can then have the remaining exterior atmosphere evacuated in preparation for moving the substrate 201 into the remainder of the first photoresist track system 100 through, e.g., a transfer station 104.

The transfer station 104 may be one or more robotic arms (not individually illustrated in FIG. 1) that can grip, move, and transfer the substrate 201 from the first loadlock chamber 102 to, e.g., the coating station 101. In an embodiment the robotic arms may extend into the loadlock chamber 102, grip the substrate 201, and transfer the substrate 201 into the transfer station 104. Once inside, the transfer station 104 may have doors that close to isolate the transfer station 104 from the loadlock chamber 102 so that the loadlock chamber 102 may again be opened to the exterior atmosphere without contaminating the remainder of the first photoresist track system 100. Once isolated from the loadlock chamber 102, the transfer station 104 may open to the next station, e.g., the coating station 101, and the robotic arms, still holding the substrate 201, may extend into the next station and deposit the substrate 201 for further processing.

In an embodiment, and as illustrated in FIG. 1, the transfer station 104 between the first loadlock chamber 102 and the coating station 101 transfers the substrate 201 directly from the first loadlock chamber 103 into the coating station 101. However, other processing stations may be located between the loadlock chamber 102 and the coating station 101. For example, cleaning stations, temperature control stations, or any other type of station which may be used to prepare the substrate 201 to receive a photoresist 211 (not illustrated in FIG. 1 but illustrated discussed below with respect to FIG. 2B) may alternatively be included. Any suitable type or number of stations may be used, and all such stations are fully intended to be included within the scope of the embodiments.

Additionally, the transfer chambers 104 are illustrated in FIG. 1 as being a separate transfer chamber 104 between each of the processing stations (e.g., between first the loadlock chamber 102 and the coating station 101, between the coating station 101 and the exposure station 106, etc.). However, this is intended to be illustrative and is not intended to be limiting upon the embodiments. The precise number of transfer chambers 104 will depend at least in part upon the overall structural layout of the various process stations. For example, if the process stations are arranged in a linear fashion (as illustrated in FIG. 1), then there may be a transfer chamber 104 between each station. However, in other embodiments in which the various process stations or groups of process stations are arranged, e.g., in one or more circles, then a single transfer chamber 104 may be utilized to move the substrates being processed (e.g., the substrate 201) into and out of the various process chambers. All such arrangements are fully intended to be included within the scope of the embodiments.

Figure 2A:
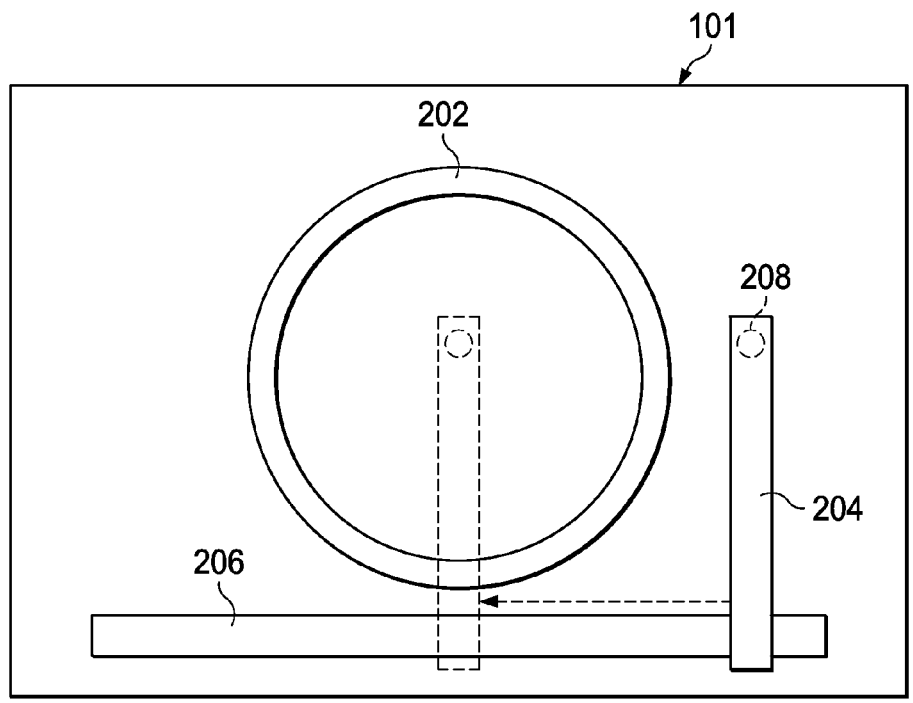
FIG. 2A-2B illustrates an application of a photoresist in accordance with an embodiment.
Figure 2B:
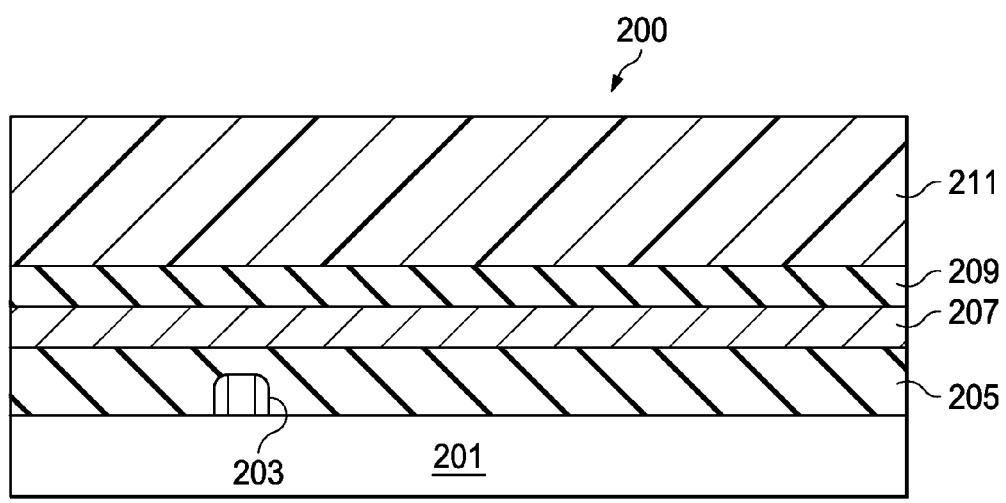

FIG. 2A illustrates a top-down view of one embodiment of the coating station 101 into which the transfer chamber 104 places the substrate 201, with FIG. 2B illustrating a cross-sectional view of the substrate 201 after being processed within the coating station 101. In an embodiment the coating station 101 is a spin-on station and comprises a rotating chuck 202, a dispensing arm 204, and a track 206. The rotating chuck 202 receives the substrate 201 from the transfer chamber 104 and holds the substrate 201 during processing.

The dispensing arm 204 has a nozzle 208 in order to dispense photoresist 211 onto the substrate 201. In an embodiment the dispensing arm 204 may be moveable relative to rotating chuck 202 so that the dispensing arm 204 can move over the substrate 201 (illustrated in FIG. 2A by the arrow and dispensing arm illustrated in dashed lines) in order to evenly dispense the photoresist 211. The dispensing arm 204 may move back and forth with the help of the track 206, which provides a fixed reference to assist the dispensing arm 204 in its movement.

During operation, the rotating chuck 202, holding the substrate 201, can rotate at a speed of about 300 rpms to about 7000 rpms, although any suitable speed may be utilized. While the rotating chuck 202 is rotating, the dispensing arm 204 may move over the substrate 201 and begin dispensing the photoresist 211 onto the substrate 201 through the nozzle 208. The rotation of the substrate 201 helps the photoresist 211 to spread evenly across the substrate 201, such as to a thickness of between about 10 nm and about 300 nm, such as about 150 nm.

However, as one of ordinary skill in the art will recognize, the spin-on configuration illustrated in FIG. 2A and described above is intended to be illustrative only and is not intended to limit the embodiments. Rather, any suitable configuration for the coating station 101 that may be used to apply the photoresist 211, such as a dip coating configuration, an air-knife coating configuration, a curtain coating configuration, a wire-bar coating configuration, a gravure coating configuration, a lamination configuration, an extrusion coating configuration, combinations of these, or the like, may alternatively be utilized. All such suitable configuration for the coating station 101 are fully intended to be included within the scope of the embodiments.

FIG. 2B illustrates a semiconductor device 200 with the substrate 201 after the dispensing of the photoresist 211. Also illustrated as being formed on the substrate 201 (prior to the application of the photoresist 211) are active devices 203 on the substrate 201, an interlayer dielectric (ILD) layer 205 over the active devices 203, metallization layers 207 over the ILD layer 205, and a layer to be patterned 209 over the ILD layer 205. The substrate 201 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices 203 are represented in FIG. 2B as a single transistor. However, as one of skill in the art will recognize, a wide variety of active devices such as capacitors, resistors, inductors and the like may be used to generate the desired structural and functional requirements of the design for the semiconductor device 200. The active devices 203 may be formed using any suitable methods either within or else on the surface of the substrate 201.

The ILD layer 205 may comprise a material such as boron phosphorous silicate glass (BPSG), although any suitable dielectrics may be used for either layer. The ILD layer 205 may be formed using a process such as PECVD, although other processes, such as LPCVD, may alternatively be used. The ILD layer 205 may be formed to a thickness of between about 100 Å and about 3,000 Å.

The metallization layers 207 are formed over the substrate 201, the active devices 203, and the ILD layer 205 and are designed to connect the various active devices 203 to form functional circuitry. While illustrated in FIG. 1 as a single layer, the metallization layers 207 are formed of alternating layers of dielectric and conductive material and may be formed through any suitable process (such as deposition, damascene, dual damascene, etc.). In an embodiment there may be four layers of metallization separated from the substrate 201 by the ILD layer 205, but the precise number of metallization layers 207 is dependent upon the design of the semiconductor device 200.

A layer to be patterned 209 or otherwise processed using the photoresist 211 is formed over the metallization layers 207. The layer to be patterned 209 may be an upper layer of the metallization layers 207 or else may be a dielectric layer (such as a passivation layer) formed over the metallization layers 207. In an embodiment in which the layer to be patterned 209 is a metallization layer, the layer to be patterned 209 may be formed of a conductive material using processes similar to the processes used for the metallization layers (e.g., damascene, dual damascene, deposition, etc.). Alternatively, if the layer to be patterned 209 is a dielectric layer the layer to be patterned 209 may be formed of a dielectric material using such processes as deposition, oxidation, or the like.

However, as one of ordinary skill in the art will recognize, while materials, processes, and other details are described in the embodiments, these details are merely intended to be illustrative of embodiments, and are not intended to be limiting in any fashion. Rather, any suitable layer, made of any suitable material, by any suitable process, and any suitable thickness, may alternatively be used. All such layers are fully intended to be included within the scope of the embodiments.

The photoresist 211 is applied to the layer to be patterned 209. In an embodiment the photoresist 211 includes a polymer resin along with one or more photoactive compounds (PACs) in a solvent. In an embodiment the polymer resin may comprise a hydrocarbon structure (such as a alicyclic hydrocarbon structure) that contains one or more groups that will decompose (e.g., an acid labile group) or otherwise react when mixed with acids, bases, or free radicals generated by the PACs (as further described below). In an embodiment the hydrocarbon structure comprises a repeating unit that forms a skeletal backbone of the polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures which may be utilized for the repeating unit of the hydrocarbon structure include methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl(meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate and the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether and the like. Examples of the styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In an embodiment the repeating unit of the hydrocarbon structure may also have either a monocyclic or a polycyclic hydrocarbon structure substituted into it, or else the monocyclic or polycyclic hydrocarbon structure may be the repeating unit, in order to form an alicyclic hydrocarbon structure. Specific examples of monocyclic structures that may be used include bicycloalkane, tricycloalkane, tetracycloalkane, cyclopentane, cyclohexane, or the like. Specific examples of polycyclic structures that may be used include adamantine, norbornane, isobornane, tricyclodecane, tetracycododecane, or the like.

The group which will decompose, otherwise known as a leaving group or, in an embodiment in which the PAC is a photoacid generator, an acid labile group, is attached to the hydrocarbon structure so that it will react with the acids/bases/free radicals generated by the PACs during exposure. In an embodiment the group which will decompose may be a carboxylic acid group, a fluorinated alcohol group, a phenolic alcohol group, a sulfonic group, a sulfonamide group, a sulfonylimido group, an (alkylsulfonyl)(alkylcarbonyl)methylene group, an (alkylsulfonyl)(alkyl-carbonyl)imido group, a bis(alkylcarbonyl)methylene group, a bis(alkylcarbonyl) imido group, a bis(alkylsylfonyl)methylene group, a bis (alkylsulfonyl)imido group, a tris(alkylcarbonyl methylene group, a tris(alkylsulfonyl)methylene group, combinations of these, or the like. Specific groups that may be utilized for the fluorinated alcohol group include fluorinated hydroxyalkyl groups, such as a hexafluoroisopropanol group. Specific groups that may be utilized for the carboxylic acid group include acrylic acid groups, methacrylic acid groups, or the like.

In an embodiment the polymer resin may also comprise other groups attached to the hydrocarbon structure that help to improve a variety of properties of the polymerizable resin. For example, inclusion of a lactone group to the hydrocarbon structure assists to reduce the amount of line edge roughness after the photoresist 211 has been developed, thereby helping to reduce the number of defects that occur during development. In an embodiment the lactone groups may include rings having five to seven members, although any suitable lactone structure may alternatively be used for the lactone group.

The polymer resin may also comprise groups that can assist in increasing the adhesiveness of the photoresist 211 to underlying structures (e.g., the layer to be patterned 209). In an embodiment polar groups may be used to help increase the adhesiveness, and polar groups that may be used in this embodiment include hydroxyl groups, cyano groups, or the like, although any suitable polar group may alternatively be utilized.

Optionally, the polymer resin may further comprise one or more alicyclic hydrocarbon structures that do not also contain a group which will decompose. In an embodiment the hydrocarbon structure that does not contain a group which will decompose may includes structures such as 1-adamantyl (meth)acrylate, tricyclodecanyl(meth)acrylate, cyclohexayl(methacrylate), combinations of these, or the like.

Additionally, the photoresist 211 also comprises one or more PACs. The PACs may be photoactive components such as photoacid generators, photobase generators, free-radical generators, or the like, and the PACs may be positive-acting or negative-acting. In an embodiment in which the PACs are a photoacid generator, the PACs may comprise halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α.-(trifluoromethylsulfonyloxy)-bicyclo[2.2.1] hept-5-ene-2,3-dicarbo-ximide (MDT), N-hydroxy-naphthalimide (DDSN), benzoin tosylate, t-butylphenyl-α-(p- toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In an embodiment in which the PACs are a free-radical generator, the PACs may comprise n-phenylglycine, aromatic ketones such as benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone, anthraquinone, 2-ethylanthraquinone, naphthaquinone and phenanthraquinone, benzoins such as benzoin, benzoinmethylether, benzomethylether, benzoinisopropylether, benzoin-n-butylether, benzoin-phenylether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer, suitable combinations of these, or the like.

In an embodiment in which the PACs are a photobase generator, the PACs may comprise quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl)cyclic amines, suitable combinations of these, or the like. However, as one of ordinary skill in the art will recognize, the chemical compounds listed herein are merely intended as illustrated examples of the PACs and are not intended to limit the embodiments to only those PACs specifically described. Rather, any suitable PAC may alternatively be utilized, and all such PACs are fully intended to be included within the scope of the present embodiments.

The individual components of the photoresist 211 may be placed into a solvent in order to aid in the mixing and placement of the photoresist 211. To aid in the mixing and placement of the photoresist 211, the solvent is chosen at least in part based upon the materials chosen for the polymer resin as well as the PACs. In particular, the solvent is chosen such that the polymer resin and the PACs can be evenly dissolved into the solvent and dispensed upon the layer to be patterned 209.

In an embodiment the solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the solvent for the photoresist 211 include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol dimethyl ether, ethylene glycol methylethyl ether, ethylene glycol monoetheryl ether, methyl cellusIve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, dietherylene glycol monoethyl ether, diethylene glycol monbutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, proplyelen glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, methyl lactate, ethyl lactate, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylehter, monopheylether, dipropylene glycol monoacetate, dioxane, methyl lactate, etheyl lactate, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; ethyl lactate or methyl lactate, methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, ethyl lactate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

However, as one of ordinary skill in the art will recognize, the materials listed and described above as examples of materials that may be utilized for the solvent component of the photoresist 211 are merely illustrative and are not intended to limit the embodiments. Rather, any suitable material that may dissolve the polymer resin and the PACs may alternatively be utilized to help mix and apply the photoresist 211. All such materials are fully intended to be included within the scope of the embodiments.

Additionally, while individual ones of the above described materials may be used as the solvent for the photoresist 211, in alternative embodiments more than one of the above described materials may be utilized. For example, the solvent may comprise a combination mixture of two or more of the materials described. All such combinations are fully intended to included within the scope of the embodiments.

Optionally, a cross-linking agent may also be added to the photoresist 211. The cross-linking agent reacts with the polymer resin within the photoresist 211 after exposure, assisting in increasing the cross-linking density of the photoresist, which helps to improve the resist pattern and resistance to dry etching. In an embodiment the cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, combinations of these, or the like.

Specific examples of materials that may be utilized as a cross-linking agent include melamine, acetoguanamine, benzoguanamine, urea, ethylene urea, or glycoluril with formaldehyde, glycoluril with a combination of formaldehyde and a lower alcohol, hexamethoxymethylmelamine, bis-methoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril, 2,3-dihydroxy-5-hydroxymethylnorbornane, 2-hydroy-5,6-bis(hydroxymethyl)norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl)p-cresol, N-methoxymethyl- or N-butoxymethyl-melamine. Additionally, compounds obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bismethoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl)ether, poly(3-chloro-2-hydroxypro-pyl)ether of a phenol novolak resin, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ethe-r of a phenol novolak resin, pentaerythritol tetra(3-acetoxy-2-hydroxyprop-yl)ether, pentaerythritol poly(3-chloroacetoxy-2-hydroxypropyl)ether, trimethylolmethane tri(3-acetoxy-2-hydroxypropyl)ether, combinations of these, or the like.

In addition to the polymer resins, the PACs, the solvents, and the cross-linking agents, the photoresist 211 may also include a number of other additives that will assist the photoresist 211 obtain the highest resolution. For example, the photoresist 211 may also include surfactants in order to help improve the ability of the photoresist 211 to coat the surface on which it is applied. In an embodiment the surfactants may include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, polyoxyethylene sorbitan fatty acid esters.

Specific examples of materials that may be used as surfactants include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol dilaurate, polyethylene glycol, polypropylene glycol, polyoxyethylenestearyl ether and polyoxyethylene cetyl ether; fluorine containing cationic surfactants, fluorine containing nonionic surfactants, fluorine containing anionic surfactants, cationic surfactants and anionic surfactants, polyethylene glycol, polypropylene glycol, polyoxyethylene cetyl ether, combinations of these, or the like.

Another additive that may be added to the photoresist 211 is a quencher, which may be utilized to inhibit diffusion of the generated acids/bases/free radicals within the photoresist, which helps the resist pattern configuration as well as to improve the stability of the photoresist 211 over time. In an embodiment the quencher is an amine such as a second lower aliphatic amine, a tertiary lower aliphatic amine, or the like. Specific examples of amines that may be used include trimethylamine, diethylamine, triethylamine, di-n-propylamine, tri-n-propylamine, tripentylamine, diethanolamine, and triethanolamine, alkanolamine, combinations of these, or the like.

Alternatively, an organic acid may be utilized as the quencher. Specific embodiments of organic acids that may be utilized include malonic acid, citric acid, malic acid, succinic acid, benzoic acid, salicylic acid, phosphorous oxo acid and its derivatives such as phosphoric acid and derivatives thereof such as its esters, such as phosphoric acid, phosphoric acid di-n-butyl ester and phosphoric acid diphenyl ester; phosphonic acid and derivatives thereof such as its ester, such as phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phosphinic acid and phenylphosphinic acid.

Another additive that may be added to the photoresist 211 is a stabilizer, which assists in preventing undesired diffusion of the acids generated during exposure of the photoresist 211. In an embodiment the stabilizer may include nitrogenous compounds such as aliphatic primary, secondary, and tertiary amines, cyclic amines such as piperidines, pyrrolidines, morpholines, aromatic heterocycles such as pyridines, pyrimidines, purines, imines such as diazabicycloundecene, guanidines, imides, amides, and others. Alternatively, ammonium salts may also be used for the stabilizer, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed.

Yet another additive that may be added to the photoresist 211 may be a dissolution inhibitor in order to help control dissolution of the photoresist 211 during development. In an embodiment bile-salt esters may be utilized as the dissolution inhibitor. Specific examples of materials that may be utilized include cholic acid (IV), deoxycholic acid (V), lithocholic acid (VI), t-butyl deoxycholate (VII), t-butyl lithocholate (VIII), and t-butyl-3-α-acetyl lithocholate (IX).

Another additive that may be added to the photoresist 211 may be a plasticizer. Plasticizers may be used to reduce delamination and cracking between the photoresist 211 and underlying layers (e.g., the layer to be patterned 209) and may comprise monomeric, loigomeric, and polymeric plasticizers such as oligo-anpolyethyleneglycol ethers, cycloaliphatic esters, and non-acid reactive steroidally-derived materials. Specific examples of materials that may be used for the plasticizer include dioctyl phthalate, didodecyl phthalate, triethylene glycol dicaprylate, dimethyl glycol phthalate, tricresyl phosphate, dioctyl adipate, dibutyl sebacate, triacetyl glycerine and the like.

Yet another additive that may be added include a coloring agent, which helps observers examine the photoresist 211 and find any defects that may need to be remedied prior to further processing. In an embodiment the coloring agent may be either a triarylmethane dye or, alternatively, may be a fine particle organic pigment. Specific examples of materials that may be used as coloring agents include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045) rhodamine 6G (C. I. 45160), Benzophenone compounds such as 2,4-dihydroxybenzophenone and 2,2',4,4'-tetrahydroxybenzophenone, salicylic acid compounds such as phenyl salicylate and 4-t-butylphenyl salicylate, phenylacrylate compounds such as ethyl-2-cyano-3,3-diphenylacrylate, and 2'-ethylhexyl-2-cyano-3,3-diphenylacrylate, benzotriazole compounds such as 2-(2-hydroxy-5-methylphenyl)-2H-benzotriazole, and 2-(3-t-butyl-2-hydroxy-5-methylphenyl)-5-chloro-2H-benzotriazole, coumarin compounds such as 4-methyl-7-diethylamino-1-benzopyran-2-one, thioxanthone compounds such as diethylthioxanthone, stilbene compounds, naphthalic acid compounds, azo dyes, Phthalocyanine blue, phthalocyanine green, iodine green, Victoria blue, crystal violet, titanium oxide, carbon black, naphthalene black, Photopia methyl violet, bromphenol blue and bromcresol green, laser dyes such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Adhesion additives may also be added to the photoresist 211 in order to promote adhesion between the photoresist 211 and an underlying layer upon which the photoresist 211 has been applied (e.g., the layer to be patterned 209). In an embodiment the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, an organophosphorus compound, 8-oxyquinoline, 4-hydroxypteridine and derivatives, 1,10-phenanthroline and derivatives, 2,2'-bipyridine and derivatives, benzotriazoles; organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations of these, or the like.

Surface leveling agents may additionally be added to the photoresist 211 in order to assist a top surface of the photoresist 211 to be level so that impinging light will not be adversely modified by an unlevel surface. In an embodiment surface leveling agents may include fluoroaliphatic esters, hydroxyl terminated fluorinated polyethers, fluorinated ethylene glycol polymers, silicones, acrylic polymer leveling agents, combinations of these, or the like.

In an embodiment the polymer resin and the PACs, along with any desired additives or other agents, are added to the solvent for application. Once added, the mixture is then mixed in order to achieve an even composition throughout the photoresist 211 in order to ensure that there are no defects caused by an uneven mixing or non-constant composition of the photoresist 211. Once mixed together, the photoresist 211 may either be stored prior to its usage or else dispensed by the coating station 101 through the nozzle 208 onto the layer to be patterned 209.

Figure 3:
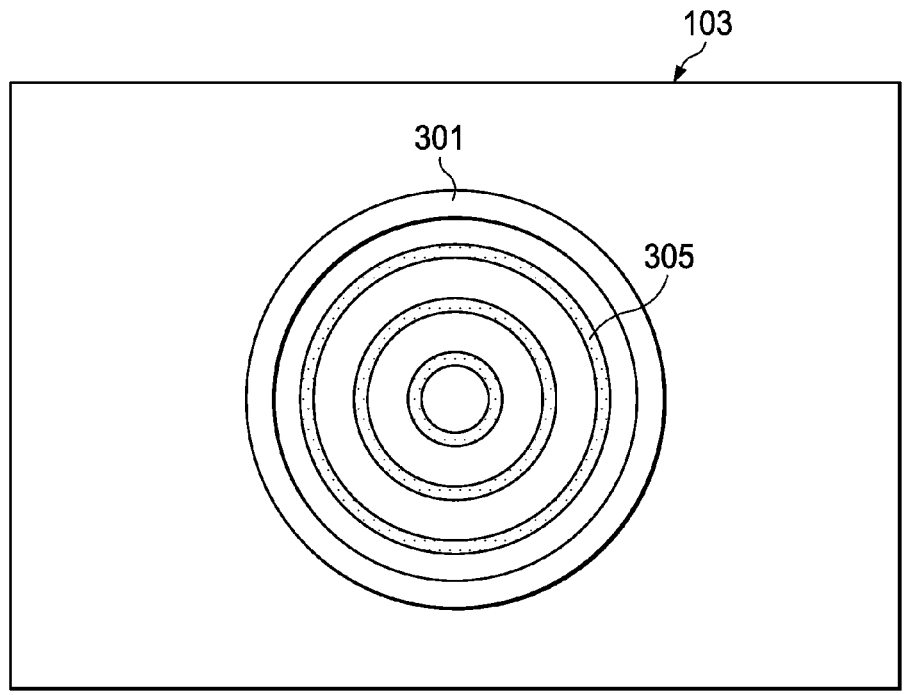
FIG. 3 illustrates a pre-development bake in accordance with an embodiment.

FIG. 3 illustrates a top-down view of the pre-bake station 103 into which the substrate 201, along with the photoresist 211, may be moved (through the transfer chamber 104) once the photoresist 211 has been applied to the substrate 201. In an embodiment the pre-bake station 103 may comprise a hot-plate 301 onto which the substrate 201 may be placed for processing. The hot-plate 301 may have located within it heating elements 303 such as resistive heating elements that raise the temperature of the hot-plate and, thus, the temperature of the substrate 201 and photoresist 211 in order to cure and dry the photoresist 211 prior to exposure to finish the application of the photoresist 211. However, any other suitable configuration, such as an annealing chamber that transfer heat through an inert atmosphere, may alternatively be utilized.

The curing and drying of the photoresist 211 removes the solvent components while leaving behind the polymer resin, the PACs, cross-linking agents, and the other chosen additives. In an embodiment the pre-bake may be performed at a temperature suitable to evaporate the solvent, such as between about 40° C. and 150° C., although the precise temperature depends upon the materials chosen for the photoresist 211. The pre-bake is performed for a time sufficient to cure and dry the photoresist 211, such as between about 10 seconds to about 5 minutes, such as about 90 seconds.

Figure 4:
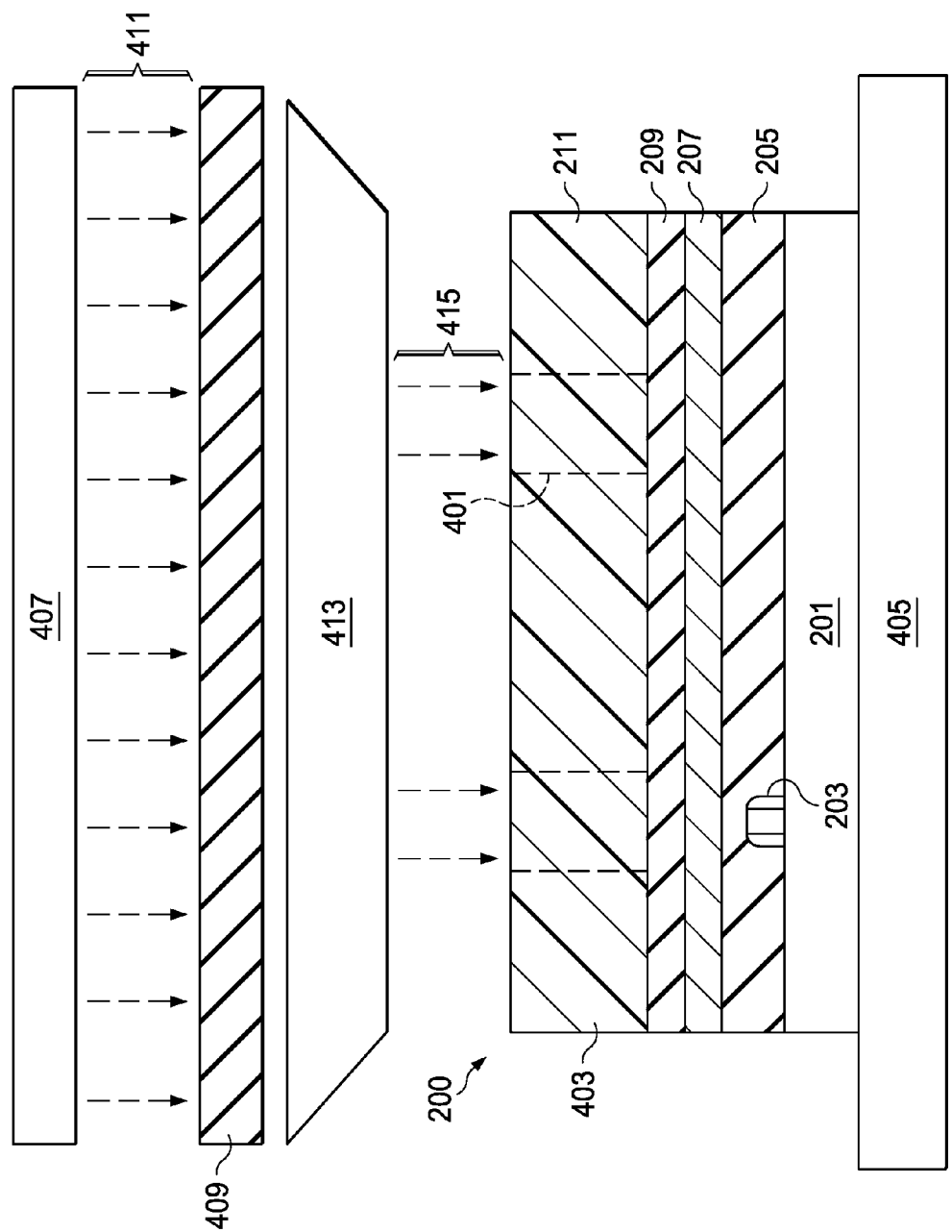
FIG. 4 illustrates an exposure of the photoresist in accordance with an embodiment.

FIG. 4 illustrates an embodiment of the exposure station 105 into which the substrate 201 and the photoresist 211 may be transferred (e.g., by a transfer station 104) after the curing and drying of the photoresist 211 in the pre-bake station 103. The exposure station 105 will expose the photoresist 211 to form an exposed region 401 and an unexposed region 403 within the photoresist 211. In an embodiment the exposure may be initiated by placing the semiconductor device 200 and the photoresist 211, once cured and dried, into an imaging device 400 for exposure. The imaging device 400 may comprise a support plate 405, an energy source 407, a patterned mask 409 between the support plate 405 and the energy source 407, and optics 413. In an embodiment the support plate 405 is a surface to which the semiconductor device 200 and the photoresist 211 may be placed or attached to and which provides support and control to the substrate 201 during exposure of the photoresist 211. Additionally, the support plate 405 may be movable along one or more axes, as well as providing any desired heating or cooling to the substrate 201 and photoresist 211 in order to prevent temperature gradients from affecting the exposure process.

In an embodiment the energy source 407 supplies energy 411 such as light to the photoresist 211 in order to induce a reaction of the PACs, which in turn reacts with the polymer resin to chemically alter those portions of the photoresist 211 to which the energy 411 impinges. In an embodiment the energy 411 may be electromagnetic radiation, such as g-rays (with a wavelength of about 436 nm), i-rays (with a wavelength of about 365 nm), ultraviolet radiation, far ultraviolet radiation, x-rays, electron beams, or the like. The energy source 407 may be a source of the electromagnetic radiation, and may be a KrF excimer laser light (with a wavelength of 248 nm), an ArF excimer laser light (with a wavelength of 193 nm), a $F_2$ excimer laser light (with a wavelength of 157 nm), or the like, although any other suitable source of energy 411, such as mercury vapor lamps, xenon lamps, carbon arc lamps or the like, may alternatively be utilized.

The patterned mask 409 is located between the energy source 407 and the photoresist 211 in order to block portions of the energy 411 to form a patterned energy 415 prior to the energy 411 actually impinging upon the photoresist 211. In an embodiment the patterned mask 409 may comprise a series of layers (e.g., substrate, absorbance layers, anti-reflective coating layers, shielding layers, etc.) to reflect, absorb, or otherwise block portions of the energy 411 from reaching those portions of the photoresist 211 which are not desired to be illuminated. The desired pattern may be formed in the patterned mask 409 by forming openings through the patterned mask 409 in the desired shape of illumination.

Optics (represented in FIG. 2 by the trapezoid labeled 213) may be used to concentrate, expand, reflect, or otherwise control the energy 411 as it leaves the energy source 407, is patterned by the patterned mask 409, and is directed towards the photoresist 211. In an embodiment the optics 413 comprise one or more lenses, mirrors, filters, combinations of these, or the like to control the energy 411 along its path. Additionally, while the optics 413 are illustrated in FIG. 4 as being between the patterned mask 409 and the photoresist 211, elements of the optics 413 (e.g., individual lenses, mirrors, etc.) may also be located at any location between the energy source 407 (where the energy 411 is generated) and the photoresist 211.

In an embodiment the semiconductor device 200 with the photoresist 211 is placed on the support plate 405. Once the pattern has been aligned to the semiconductor device 200, the energy source 407 generates the desired energy 411 (e.g., light) which passes through the patterned mask 409 and the optics 413 on its way to the photoresist 211. The patterned energy 415 impinging upon portions of the photoresist 211 induces a reaction of the PACs within the photoresist 211. The chemical reaction products of the PACs' absorption of the patterned energy 415 (e.g., acids/bases/free radicals) then reacts with the polymer resin, chemically altering the photoresist 211 in those portions that were illuminated through the patterned mask 409.

In a specific example in which the patterned energy 415 is a 193 nm wavelength of light, the PAC is a photoacid generator, and the group to be decomposed is a carboxylic acid group on the hydrocarbon structure and a cross linking agent is used, the patterned energy 415 will impinge upon the photoacid generator and the photoacid generator will absorb the impinging patterned energy 415. This absorption initiates the photoacid generator to generate a proton (e.g., a H+ atom) within the photoresist 211. When the proton impacts the carboxylic acid group on the hydrocarbon structure, the proton will react with the carboxylic acid group, chemically altering the carboxylic acid group and altering the properties of the polymer resin in general. The carboxylic acid group will then react with the cross-linking agent to cross-link with other polymer resins within the photoresist 211.

Optionally, the exposure of the photoresist 211 may occur using an immersion lithography technique. In such a technique an immersion medium (not individually illustrated in FIG. 2) may be placed between the imaging device 400 (and particularly between a final lens of the optics 413) and the photoresist 211. With this immersion medium in place, the photoresist 211 may be patterned with the patterned energy 415 passing through the immersion medium.

In this embodiment a protective layer (also not individually illustrated in FIG. 2) may be formed over the photoresist 211 in order to prevent the immersion medium from coming into direct contact with the photoresist 211 and leaching or otherwise adversely affecting the photoresist 211. In an embodiment the protective layer is insoluble within the immersion medium such that the immersion medium will not dissolve it and is immiscible in the photoresist 211 such that the protective layer will not adversely affect the photoresist 211. Additionally, the protective layer is transparent so that the patterned energy 415 may pass through the protective layer without hindrance.

In an embodiment the protective layer comprises a protective layer resin within a protective layer solvent. The material used for the protective layer solvent is, at least in part, dependent upon the components chosen for the photoresist 211, as the protective layer solvent should not dissolve the materials of the photoresist 211 so as to avoid degradation of the photoresist 211 during application and use of the protective layer. In an embodiment the protective layer solvent includes alcohol solvents, fluorinated solvents, and hydrocarbon solvents.

Specific examples of materials that may be utilized for the protective layer solvent include methanol, ethanol, 1-propanol, isopropanol, n-propanol, 1-butanol, 2-butanol, 2-methyl-2-propanol, 3-methyl-1-butanol, isobutyl alcohol, tert-butyl alcohol, 1-pentanol, 2-pentanol, 3-pentanol, n-hexanol, cyclohecanol, 1-hexanol, 1-heptanol, 1-octanol, 2-hexanol, 2-heptanol, 2-octanol, 3-hexanol, 3-heptanol, 3-octanol, 4-octanol, 2-methyl-2-butanol, 3-methyl-1-butanol, 3-methyl-2-butanol, 2-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro-1,8-diol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, perfluorotetrapentylamine, toluene, xylene and anisole, and aliphatic hydrocarbon solvents, such as n-heptane, n-nonane, n-octane, n-decane, 2-methylheptane, 3-methylheptane, 3,3-dimethylhexane, 2,3,4-trimethylpentane, combinations of these, or the like.

The protective layer resin may, similar to the photoresist 211, comprise a protective layer repeating unit. In an embodiment the protective layer repeating unit may be an acrylic resin with a repeating hydrocarbon structure having a carboxyl group, an alicyclic structure, an alkyl group having one to five carbon atoms, a phenol group, or a fluorine atom-containing group. Specific examples of the alicyclic structure include a cyclohexyl group, an adamantyl group, a norbornyl group, a isobornyl group, a tricyclodecyl group, a tetracyclododecyl group, and the like. Specific examples of the alkyl group include an n-butyl group, an isobutyl group, or the like. However, any suitable protective layer resin may alternatively be utilized.

The protective layer may also include additional additives to assist in such things as adhesion, surface leveling, coating, and the like. For example, the protective layer may further comprise a protective layer surfactant, although other additives may also be added, and all such additions are fully intended to be included within the scope of the embodiment. In an embodiment the protective layer surfactant may be an alkyl cationic surfactant, an amide-type quaternary cationic surfactant, an ester-type quaternary cationic surfactant, an amine oxide surfactant, a betaine surfactant, an alkoxylate surfactant, a fatty acid ester surfactant, an amide surfactant, an alcohol surfactant, an ethylenediamine surfactant, or a fluorine- and/or silicon-containing surfactant.

Specific examples of materials that may be used for the protective layer surfactant include polyoxyethylene alkyl ethers, such as polyoxyethylene lauryl ether, polyoxyethylene stearyl ether, polyoxyethylene cetyl ether and polyoxyethylene oleyl ether; polyoxyethylene alkyl aryl ethers, such as polyoxyethylene octyl phenol ether and polyoxyethylene nonyl phenol ether; polyoxyethylene-polyooxypropylene block copolymers; sorbitan fatty acid esters, such as sorbitan monolaurate, sorbitan monopalmitate, sorbitan monostearate, sorbitan monooleate, sorbitan trioleate and sorbitan tristearate; and polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

Prior to application of the protective layer onto the photoresist 211, the protective layer resin and desired additives are first added to the protective layer solvent to form a protective layer composition. The protective layer solvent is then mixed to ensure that the protective layer composition has a consistent concentration throughout the protective layer composition.

Once the protective layer composition is ready for application, the protective layer composition may be applied over the photoresist 211. In an embodiment the application may be performed using a process such as a spin-on coating process, a dip coating method, an air-knife coating method, a curtain coating method, a wire-bar coating method, a gravure coating method, a lamination method, an extrusion coating method, combinations of these, or the like. In an embodiment the photoresist 211 may be applied such that it has a thickness over the surface of the photoresist 211 of about 100 nm.

After the protective layer composition has been applied to the photoresist 211, a protective layer pre-bake may be performed in order to remove the protective layer solvent. In an embodiment the protective layer pre-bake may be performed at a temperature suitable to evaporate the protective layer solvent, such as between about 40° C. and 150° C., although the precise temperature depends upon the materials chosen for the protective layer composition. The protective layer pre-bake is performed for a time sufficient to cure and dry the protective layer composition, such as between about 10 seconds to about 5 minutes, such as about 90 seconds.

Once the protective layer has been placed over the photoresist 211, the semiconductor device 200 with the photoresist 211 and the protective layer are placed on the support plate 405, and the immersion medium may be placed between the protective layer and the optics 413. In an embodiment the immersion medium is a liquid having a refractive index greater than that of the surrounding atmosphere, such as having a refractive index greater than 1. Examples of the immersion medium may include water, oil, glycerine, glycerol, cycloalkanols, or the like, although any suitable medium may alternatively be utilized.

The placement of the immersion medium between the protective layer and the optics 413 may be done using, e.g., an air knife configuration of the exposure station 105, whereby fresh immersion medium is applied to a region between the protective layer and the optics 413 and controlled using pressurized gas directed towards the protective layer to form a barrier and keep the immersion medium from spreading. In this embodiment the immersion medium may be applied, used, and removed from the protective layer for recycling so that there is fresh immersion medium used for the actual imaging process.

However, the air knife configuration for the exposure station 105 described above is not the only configuration which may be used to expose the photoresist 211 using an immersion method. Any other suitable configuration using an immersion medium, such as immersing the entire substrate 201 along with the photoresist 211 and the protective layer or using solid barriers instead of gaseous barriers may also be utilized. Any suitable method for exposing the photoresist 211 through the immersion medium may be used, and all are fully intended to be included within the scope of the embodiments.

Figure 5:
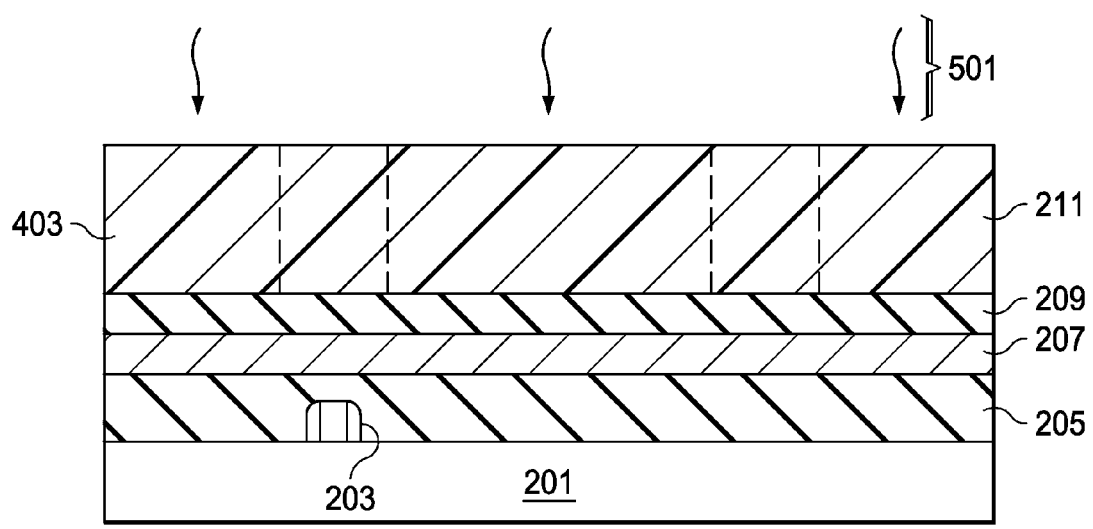
FIG. 5 illustrates a post-exposure baking in accordance with an embodiment.

FIG. 5 illustrates that, after the photoresist 211 has been exposed to the patterned energy 415 in the exposure station 105, the substrate 201 and the photoresist 211 may be moved from the exposure station 105 to the post-bake station 107 using, e.g., the transfer chamber 204. In an embodiment post-bake station 107 may be similar to the pre-bake station 103 (further described above with respect to FIG. 3), such as by being a hot-plate 301 with heating elements 303 located within the hot-plate 301. However, any other suitable type of heating system, including furnaces or steam-based heating systems, may alternatively be utilized.

Once in the post-bake station 107, a first post-exposure bake (PEB) (represented in FIG. 5 by the wavy lines labeled 501) may be used in order to assist in the generating, dispersing, and reacting of the acid/base/free radical generated from the impingement of the energy 411 upon the PACs during the exposure in the exposure station 105. Such assistance helps to create or enhance chemical reactions which generate chemical differences and different polarities between the exposed region 401 and the unexposed region 403 within the photoresist 211. These chemical differences also cause differences in the solubility between the exposed region 401 and the unexposed region 403. In an embodiment the substrate 201 with the photoresist 211 may be placed on the hot-plate 301 and the temperature of the photoresist 211 may be increased to between about 50° C. and about 160° C. for a period of between about 40 seconds and about 120 seconds.

Returning now to FIG. 1, the first photoresist track system 100 may also comprise a positive tone developer station 109 which can be used, if desired, to develop the photoresist 211 with a positive tone developer and which comprises equipment and chemicals which are specific to a positive tone development process. In an embodiment the positive tone developer station 109 may be connected to the post-bake station 107 through, e.g., the transfer stations 104 so that the substrate 200 and photoresist 211 may be transferred to the positive tone developer station 109 shortly after the PEB 501 without breaking the interior environment of the first photoresist track system 100.

However, as manufacturers of semiconductor devices have begun to turn away from using a positive tone development process and have begun to implement negative tone development of photoresists 211, the positive tone developer station 109 that is currently fully integrated within the first photoresist track system 100 is not utilized and is redundant or even detrimental to the use of a negative tone developer. Further, costs and technical difficulties abound with physically modifying the first photoresist track system 100 such that the positive tone developer station 109 may be used to develop the photoresist 211 with a negative tone developer, thereby making such a solution at best undesirable and at worst impossible to perform.

Given this, FIG. 1 also illustrates an off-line negative tone developer station 113 that may be used to by-pass the positive tone developer station 109 and develop the photoresist 211 with a negative tone developer in order to account for these issues while still maintaining the use of the remainder of the first photoresist track system 100 (e.g., the coating station 101, the pre-bake station 103, the exposure station 105, etc.). In an embodiment, after the substrate 200 and the photoresist 211 have finished the PEB 301 in the post-bake station 107, the transfer stations 104 may remove the substrate 201 and the photoresist 211 from the post-bake station 107 and, instead of transferring the substrate 201 and the photoresist 211 to the positive tone developer station 109, transfer the substrate 201 and the photoresist 211 to either the first loadlock chamber 102 or the second loadlock chamber 114 so that the substrate 201 and the photoresist 211 may be entirely removed from the first photoresist track system 100.

Alternatively, if desired, once the substrate 200 and the photoresist 211 have finished the PEB 301 in the post-bake station 107, the internal atmosphere of the first photoresist track system 100 may be broken and the semiconductor device 200 and the photoresist 211 are removed directly from the PEB station 407 and removed from the first photoresist track system 100 itself.

Once the substrate 201 and the photoresist 211 have been removed from the first photoresist track system 100, the substrate 201 and the photoresist 211 are moved to the negative tone developer station 113. In an embodiment the negative tone developer station 113 is an offline developer machine that is separate from and physically removed from the first photoresist track system 100, and has a separate internal operating environment from the first photoresist track system 100. In such an embodiment the substrate 201 and the photoresist 211 may be exposed to an exterior atmosphere or, alternatively, may not be exposed by placing the substrate 201 and the photoresist 211 into a protective carrier (not separately illustrated in FIG. 1).

Optionally, an idle/storage unit 115 may be incorporated within the transfer of the semiconductor device 200 and photoresist 211 in order to assist in controlling diffusion within the photoresist 211 that may affect critical dimensions of the photoresist 211. In particular after the photoresist 211 has been exposed and a PEB 501 has been performed, the PACs are very active in the exposed region 401 of the photoresist 211 and generate a strong acid with a high concentration. This strong acid will not only deprotect the acid leaving group/group which will decompose located on the hydrocarbon structures within the exposed regions 401, but will also begin to diffuse according to Fick's law, which is recited below as Equation 1:

$$J = -D\frac{\partial \phi}{\partial x} \qquad \text{Equation 1}$$

Where:
J is the diffusion flux per unit area per unit time;
D is the diffusion coefficient or diffusivity in dimensions of length$^2$/time;
Φ is the concentration in dimensions of (amount of substance/length$^3$; and
X is the position (length)

Such diffusion, if not properly controlled, can affect the critical dimensions desired of the photoresist 211. For example, if the strong acids generated by the PACs are in the process of actively diffusing when a development process is begun, then natural variations in the diffusion may cause the strong acids to diffuse at different rates in different areas of the photoresist 211. Such variations may affect the actual desired dimensions of the photoresist 211 after development.

However, by incorporating the idle/storage unit 115 and by allowing the substrate 201 and the photoresist 211 to idle after the first PEB 501 (in other words, after the strong acids have been generated), then the strong acids will diffuse outward during the idle time period. This time period allows the diffusion of the strong acid to stabilize and the critical dimension of the photoresist 211 will decrease with the stabilization of the diffusion. In an embodiment the idle time between removing the semiconductor device 200 and photoresist 211 from the first photoresist track system 100 and placing the semiconductor device 200 and photoresist 211 into the negative tone developer station 113 may be between about 1 minute and about 2 days.

The idle/storage unit 115 may be a storage unit or storage area where the semiconductor device 200 and photoresist 211 may be stored or otherwise held in an idle state during which no significant processing is performed on the substrate 201 or the photoresist 211. The idle/storage unit 115 may be exposed to an ambient atmosphere or, alternatively, may be enclosed and either filled with an inert gas or else evacuated in order to reduce the amount of contamination that an ambient environment may cause to the photoresist 211.

Figure 6A:
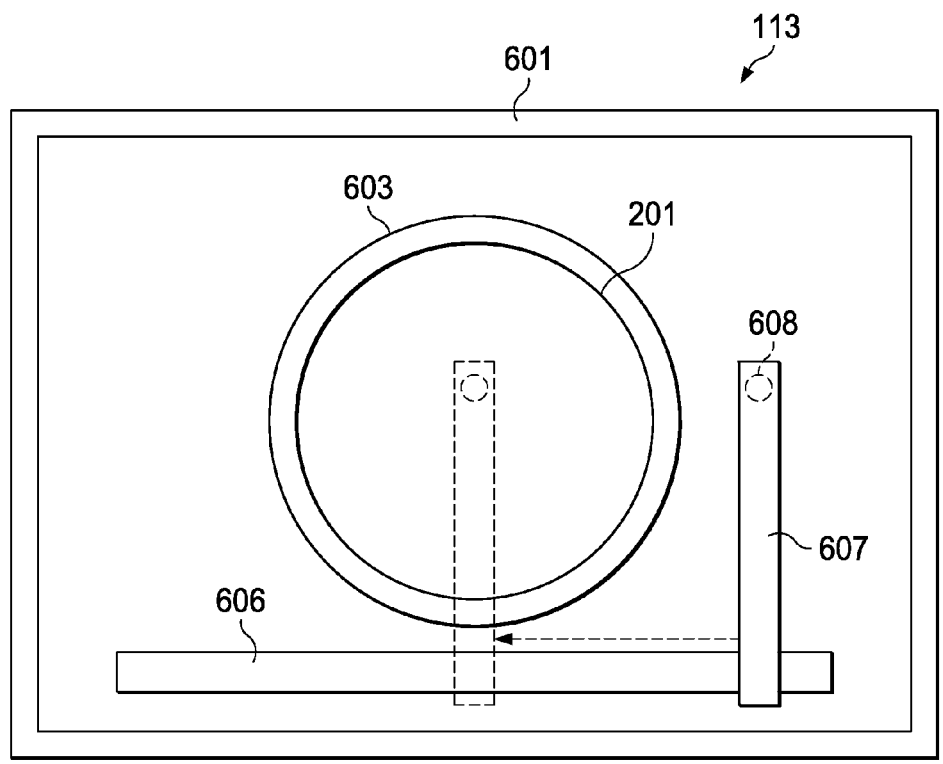
FIGS. 6A-6C illustrate a development of the photoresist in an offline negative tone development in accordance with an embodiment.
Figure 6B:
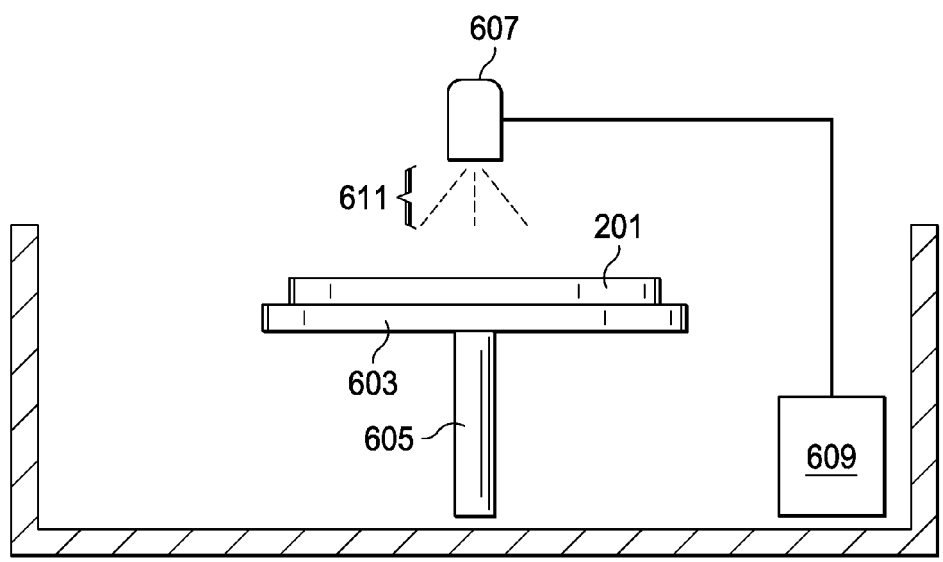

FIGS. 6A-6B illustrates a top-down view and a representative cross-sectional view of an embodiment of the negative tone developer station 113 in which the negative tone developer station 113 uses a spin-on method to apply the negative tone developer. In an embodiment the negative tone developer station 113 comprises a rotating developer chuck 603 attached to a rotating spindle 605. A negative tone developer dispensing arm 607 with a negative tone developer nozzle 608 (on a negative tone developer track 606) is operably connected to a negative tone developer storage tank 609 so that the negative tone developer storage tank 609 supplies fresh negative tone developer 611 to the negative tone developer dispensing arm 607.

In an embodiment the substrate 201 is placed onto the rotating developer chuck 603 and is held in place using, e.g., a vacuum pressure from below the rotating developer chuck 603. The rotating spindle 605 to which the rotating developer chuck 603 is attached is engaged, thereby rotating the rotating developer chuck 603, the substrate 201, and the photoresist 211, at a speed of between about 500 rpm and about 3500 rpm. Once the photoresist 211 is rotating at the desired speed, the negative tone developer dispensing arm 607 moves over the rotating photoresist 211 and begins to dispense the photoresist 211 with the negative tone developer 611 out of the negative tone developer nozzle 608 at a rate of between about 0.5 cc/sec and about 20 cc/sec, at a temperature of between about 10° C. and about 50° C., such as about 50° C., for a period of time between about 10 second and about 60 minutes, such as about 30 minutes.

In an embodiment the negative tone developer dispensing arm 607 dispenses a negative tone developer 611, such as an organic solvent or critical fluid to remove those portions of the photoresist 211 which were not exposed to the energy and, as such, retain their original solubility. Specific examples of materials that may be utilized include hydrocarbon solvents, alcohol solvents, ether solvents, ester solvents, critical fluids, combinations of these, or the like. Specific examples of materials that can be used for the negative tone solvent include hexane, heptane, octane, toluene, xylene, dichloromethane, chloroform, carbon tetrachloride, trichloroethylene, methanol, ethanol, propanol, butanol, critical carbon dioxide, diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether, acetone, methyl ethyl ketone, methyl isobutyl ketone, isophorone, cyclohexanone, methyl acetate, ethyl acetate, propyl acetate, butyl acetate, pyridine, formamide, N,N-dimethyl formamide, or the like. In an embodiment in which immersion lithography is utilized to expose the photoresist 211 and a protective layer is utilized to protect the photoresist 211 from the immersion medium, the developer 611 may be chosen to remove not only those portions of the photoresist 211 that are desired to be removed, but may also be chosen to remove the protective layer in the same development step. Alternatively, the protective layer may be removed in a separate process, such as by a separate solvent from the developer 611 or even an etching process to remove the protective layer from the photoresist 211 prior to development.

However, while the spin-on method and configuration described herein for the negative tone developer station 113 is one suitable method for developing the photoresist 211 in the negative tone developer station 113, it is intended to be illustrative and is not intended to limit the embodiment. Rather, the negative tone developer station 113 may comprise any mechanism and chemicals in any configuration for any type of development process, include a dip process configuration, a puddle process configuration, combinations of these, or the like. All such development processes and configuration for the negative tone developer station 113 are fully intended to be included within the scope of the embodiments.

Additionally, in an embodiment all of the mechanics and other structures that make up the negative tone developer station 113 (e.g., the rotating developer chuck 603, the rotating spindle 605, the negative tone developer dispensing arm 607, etc.) are housed within an exterior housing 601, which provides support and protection to the internal components of the negative tone developer station 113. In an embodiment the exterior housing 601 encloses the negative tone developer station 113 and is separate and isolated from the first photoresist track system 100. Additionally, any utilities, such as electricity or fresh raw materials (e.g., fresh negative tone developer or fresh rinse water), may come in, if desired, through the exterior housing 601, but do not originate from the first photoresist track system 100. As such, the negative tone developer station 113 is an offline developer machine that is independent from the first photoresist track system 100.

Figure 6C:
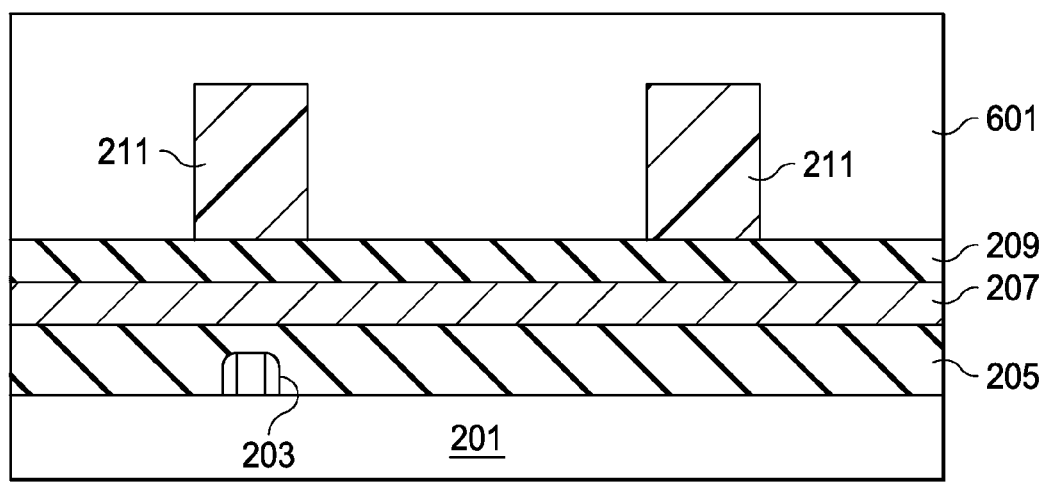

FIG. 6C illustrates a cross-sectional view of the application of the negative tone developer 611 onto the photoresist 211. In an embodiment the negative tone developer 611 will dissolve the unexposed regions 403 of the photoresist 211 that were not exposed to the patterned energy 215. This dissolving will leave behind the exposed regions 401 of the photoresist 211 that had been exposed to the patterned energy 215, thereby transferring the pattern of the patterned energy 215 to the photoresist 211. Once finished, the negative tone developer 611 may be removed by stopping the dispensing of the negative tone developer 611 while keeping the substrate 201 spinning to remove the negative tone developer 611 and performing an optional rinse with, e.g., deionized water.

Returning now to FIG. 1, after the photoresist 211 has been developed in the offline negative tone developer station 113, the substrate 201 and the photoresist 211 may optionally be returned to the first photoresist track system 100 (represented in FIG. 1 by the dashed line 116). In an embodiment in which the substrate 201 and the photoresist 211 are returned to the first photoresist track system 100, the substrate 201 and the photoresist 211 may be returned, e.g., by placing the substrate 201 and the photoresist 211 into either the first loadlock chamber 102 or the second loadlock chamber 114. Once within the first photoresist track system 100, the transfer stations 104 may engage and move the substrate 201 and the photoresist 211 into the first hard bake station 111 for further processing.

Alternatively, if the first photoresist track system 100 has been opened to remove the substrate 201 and the photoresist 211, then the substrate 201 and the photoresist 211 may be replaced into the first photoresist track system 100, e.g., by placing the substrate 201 and the photoresist 211 into the first hard bake station 111. Once returned, the first photoresist track system 100 may be resealed and isolated from the exterior environment.

Once the substrate 201 and the photoresist 211 are in position, the first hard bake station 111 may optionally be used to help polymerize and stabilize the photoresist 211 after the development process, and also aids in improving the adhesion of the photoresist 211 to the layer to be patterned 209. In an embodiment the first hard bake station 111 may be similar to the post-bake station 107, such as by being a hot-plate station with a hot plate 301 (see, e.g., FIG. 3) and heating elements 305 located within the hot-plate 301. However, any suitable type of heating station, such as a furnace or steam-heating station, may alternatively be utilized.

In an embodiment in which the first hard bake station 111 is a hot-plate station, the substrate 201 with the photoresist 211 is placed onto the hot-plate 301 and the heating elements 305 are engaged to raise the temperature of the photoresist 211 to between about 70° C. to about 130° C. The photoresist may be kept at this temperature for between about 1 minute to about 3 minutes.

Once the hard bake has been performed on the photoresist 211, and any other processes such as rinsing or drying that may be desired, the substrate 201 with the photoresist 211 may be removed from the first photoresist track system 100 through the second loadlock chamber 114. Similar to the first loadlock chamber 102, the second loadlock chamber 114 allows the substrate 201 to be removed from the first photoresist track system 100 without exposing the interior stations to the exterior atmosphere.

By utilizing the offline development of the negative tone developer station 113, the first photoresist track system 100 that has an integrated positive tone developer station 109 may still be utilized for coating, pre-baking, exposing, post-baking, and other processes that may be used for a negative tone development without using the positive tone developer station 109. As such, costly changes to the first photoresist track system 100 or the costly purchasing of a brand new track system with an integrated negative tone developer station may be avoided. This makes the overall manufacturing process cheaper and more efficient.

Figure 7A:
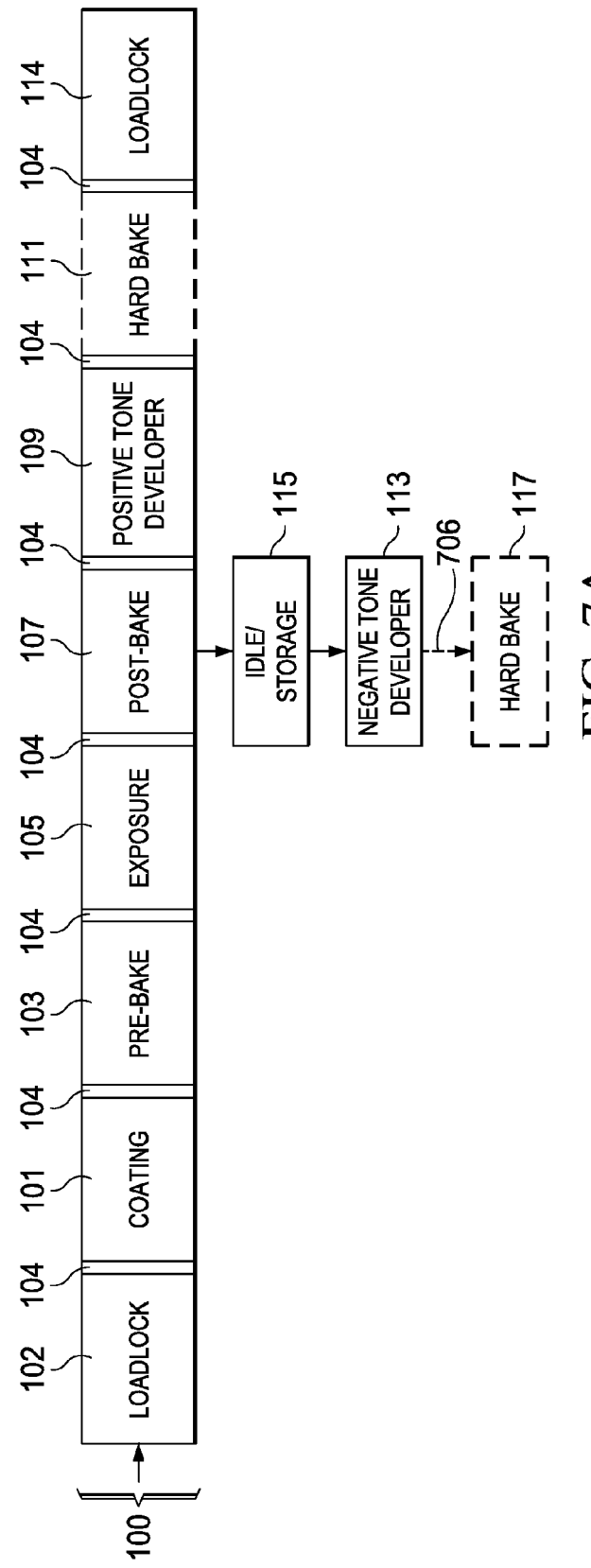
FIG. 7A-7B illustrate alternative embodiments of the negative tone developer in accordance with an embodiment.

FIG. 7A illustrates another embodiment in which the substrate 201 is not returned to the first photoresist track system 100 after development in the negative tone developer station 113. In an embodiment the substrate 201 is sent for further processing after the negative tone developer station 113 has developed the photoresist 211.

Optionally (as represented in FIG. 7A by the dashed lines), if desired a second hard bake station 117 that is separate and isolated from the first photoresist track system 100 may be utilized to perform a hard bake process for the photoresist 211 after development. In an embodiment the second hard bake station 117 may be similar to the first hard bake station 111, such as by being a hot-plate station with a hot-plate 301 and heating elements within the hot plate 301, and a similar process with similar temperatures and times may be performed using the second hard bake station 117.

However, the second hard bake station 117 is notably offline from the first photoresist track system 100. In particular, it does not share a similar atmosphere and is not isolated from the exterior environment by a common exterior wall as the first photoresist track system 100. By keeping the second hard bake station 117 offline from the first photoresist track system 100, the substrate 201 and the photoresist 211 do not need to be returned to the first photoresist track system 100, thereby allowing for the first photoresist track system 100 to be utilized for other processing once the substrate 201 and photoresist 211 have been removed from the first photoresist track system 100.

Figure 7B:
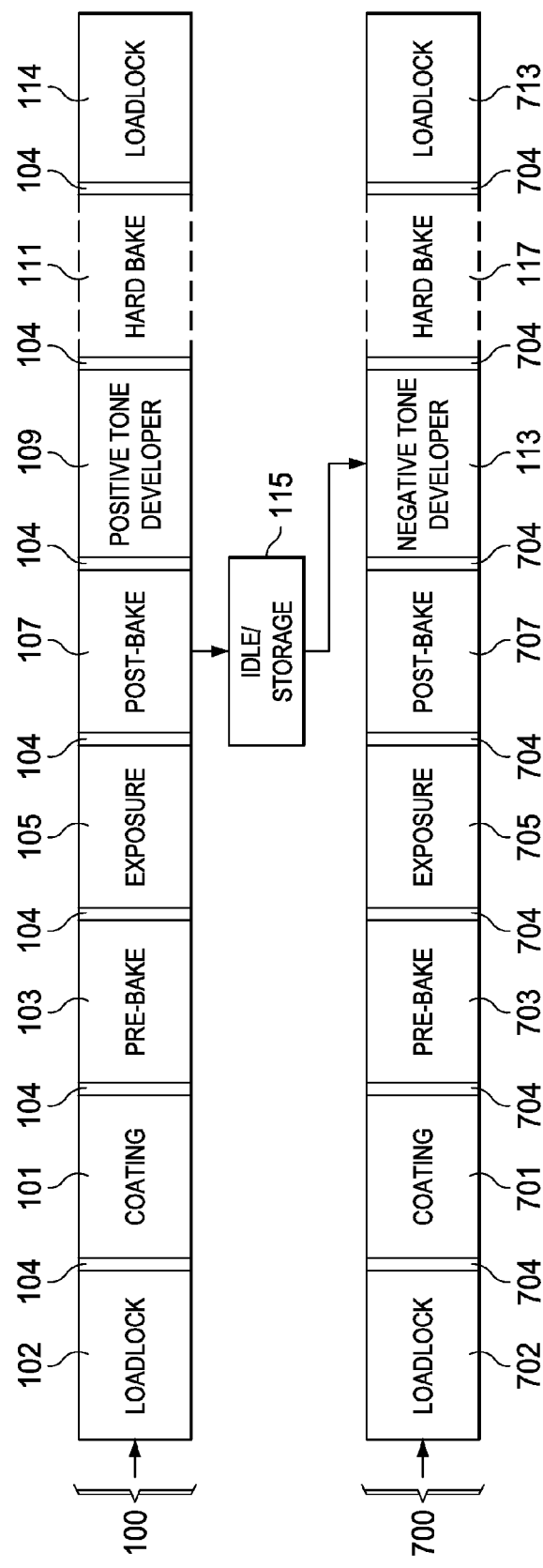

FIG. 7B illustrates yet another embodiment in which the negative tone developer station 113 and the optional second hard bake station 117, while being offline from the first photoresist track system 100, are integrated into a second photoresist track system 700. In an embodiment the second first photoresist track system 100 comprises a third loadlock chamber 702, a second coating station 701, a second pre-bake station 703, a second exposure station 705, a second post-bake station 707, and a fourth loadlock chamber 713 that are similar to the first loadlock chamber 102, the coating station 101, the pre-bake station 103, the exposure station 105, the post-bake station 107, and the second loadlock chamber 114, respectively, although these stations may be different from the stations within the first photoresist track system 100. Additionally second transfer chambers 704

In an embodiment the substrate 201 and photoresist 211, after a post-bake process has been performed in the first photoresist track system 100, may be removed and, after the optional idle/storage in the idle/storage unit 115, may be placed into the second photoresist track system 700. In an embodiment the substrate 201 may be placed into the third loadlock chamber 702 and the second transfer chambers 704 may be used to move the substrate 201 and photoresist 211 to the negative tone developer station 113, although alternatively, the second photoresist track system 700 may be physically opened and the substrate 201 and photoresist 211 be placed inside the second photoresist track system 700 before resealing the second photoresist track system 700. Once inside the second photoresist track system 700, the processing of the substrate 201 and the photoresist 211 may be performed as described above with respect to FIGS. 1-6C, only being performed with the assistance of the second photoresist track system 700.

Figure 8:
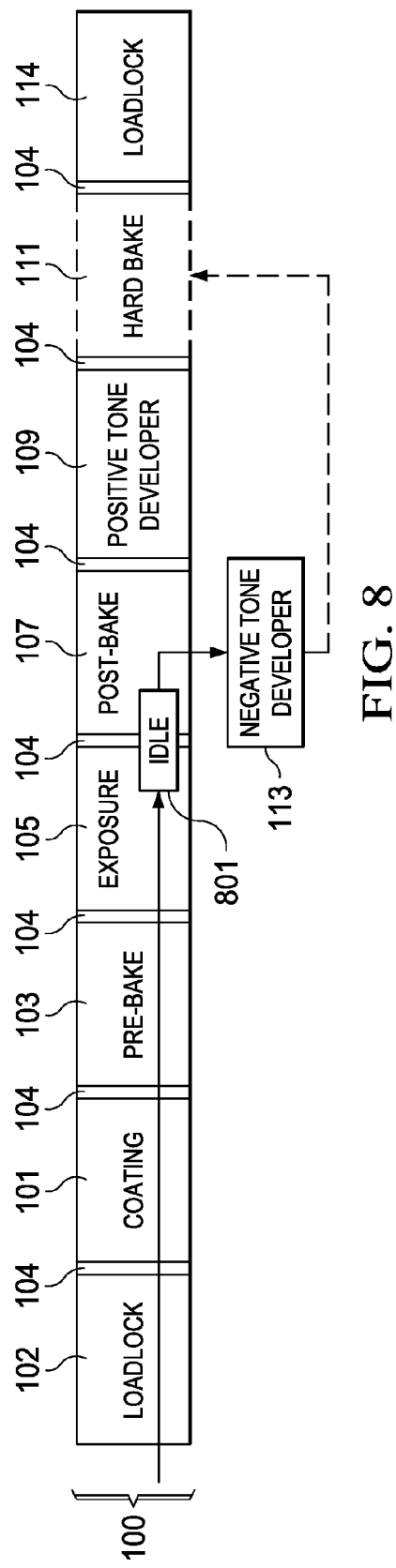
FIG. 8 illustrates an idle performed prior to a post-exposure bake in accordance with an embodiment.

FIG. 8 illustrates an alternative embodiment for using the negative tone developer station 113 in which the diffusion of the strong acids is retarded before the semiconductor device 200 and photoresist 211 are removed from the first photoresist track system 100 and placed into the negative tone developer station 113. In an embodiment the semiconductor device 200 and photoresist 211 are idled or stored (represented in FIG. 8 by the "Idle" box labeled 801) after the photoresist 211 has been exposed (in the exposure station 105) but prior to the first PEB 501 (in the post-bake station 107). In an embodiment the semiconductor device 200 and photoresist 211 may be idled until the negative tone development process (in the negative tone development station 413) may be performed immediately after the first PEB 501.

By idling the semiconductor device 200 and the photoresist 211 prior to the first PEB 501, the additional generation of the acids/bases/free radicals from the PACs in the post-bake (those not generated by the exposure), is delayed. By delaying the formation of these acids/base/free radicals, the concentration of the acids/bases/free radicals during the time period in which the photoresist 211 is idled is lowered, thereby retarding and reducing the amount of diffusion that will occur during the time in which the semiconductor device 200 and photoresist 211 are idled. Once the negative tone developer station 113 is ready, the semiconductor device 200 and photoresist 211 may receive the first PEB 501 (in the post-bake station 107) before being removed from the first photoresist track system 100 and placed in the negative tone developer station 113 for negative tone development.

In an embodiment the idle 801 of the photoresist 211 may be performed by simply stopping the processing of the photoresist 211 after the exposure in the exposure station 105. Alternatively, the substrate 201 and the photoresist 211 may be removed from the first photoresist track system 100 and placed in a separate idle/storage area (e.g., the idle/storage unit 115 illustrated in FIG. 1) separated from the first photoresist track system 100. Once the idle process has completed, the substrate 201 and the photoresist 211 may be returned to the first photoresist track system 100 to continue processing.

Figure 9:
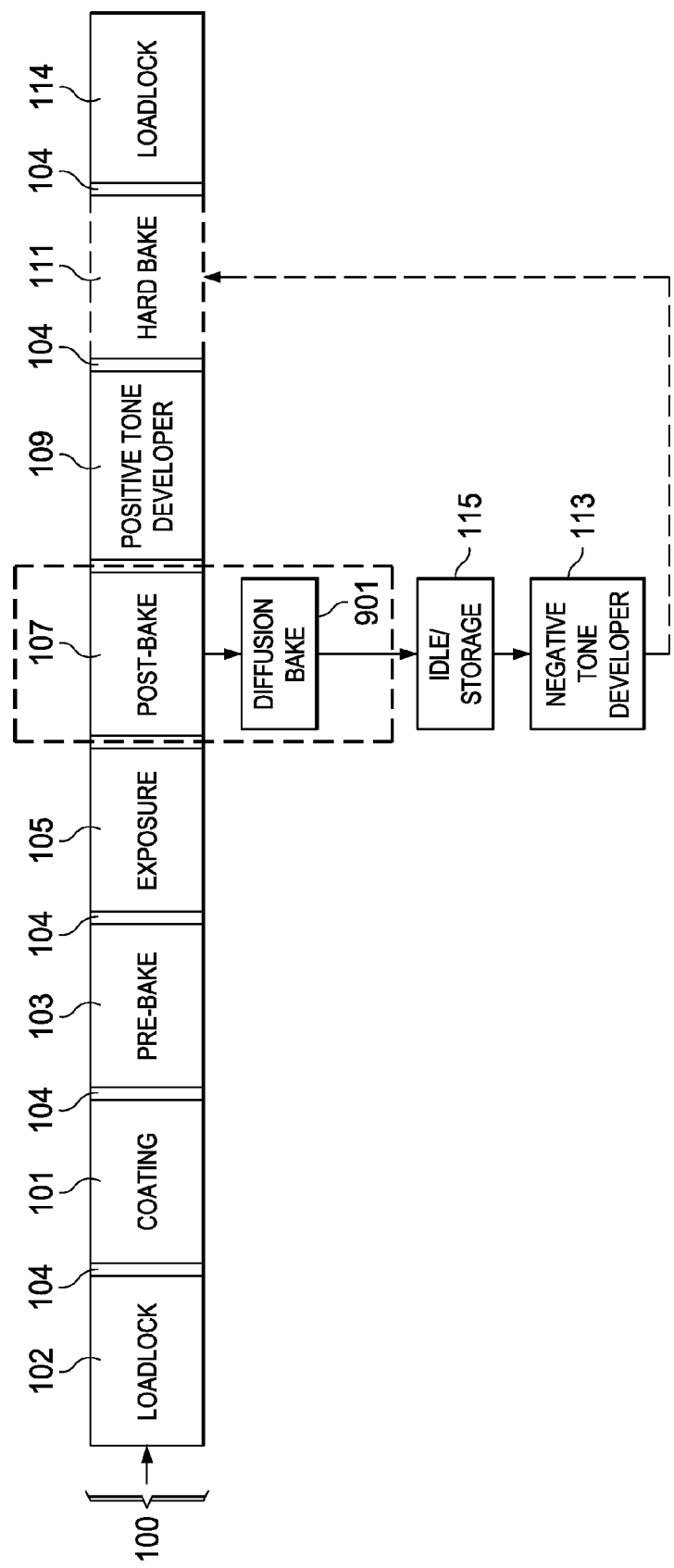
FIG. 9 illustrates a two bake process prior to an idle in accordance with an embodiment.

FIG. 9 illustrates another embodiment that may be used to reduce the time (and thereby increase throughput) spent in idle between the first PEB 501 and the negative tone developer station 113. In this embodiment the first PEB 501 is performed on the photoresist 211 prior to removing the substrate 201 and the photoresist 211 from the first photoresist track system 100. However, also prior to the idle/storage of the substrate 201 and the photoresist 211, a diffusion bake (represented in FIG. 9 by the box labeled 901) is performed. In an embodiment the diffusion bake 901 may be performed in order to accelerate the diffusion of the strong acids generated by the exposure and the post-bake beyond the normal rate of diffusion that would occur during the idle/storage time. By accelerating the diffusion of the strong acids, the diffusion will stabilize in a faster time period than without the diffusion bake 901. As such, the time that the substrate 201 and the photoresist 211 have to spend in idle/storage 115 prior to development may be reduced. Such a reduction in time allows for a more efficient process and a higher throughput.

In an embodiment the diffusion bake 901 may be performed in the post-bake station 107 after the first PEB 501 has been performed (as represented in FIG. 9 by the dashed box). Alternatively, the diffusion bake 901 may be performed in a separate baking station (not illustrated in FIG. 5) either integrated within the first photoresist track system 100 or else separate from the first photoresist track system 100. The diffusion bake may occur at a temperature of between about 30° C. and about 100° C. and may be performed for a time period of about 10 seconds to about 300 seconds.

Figure 10:
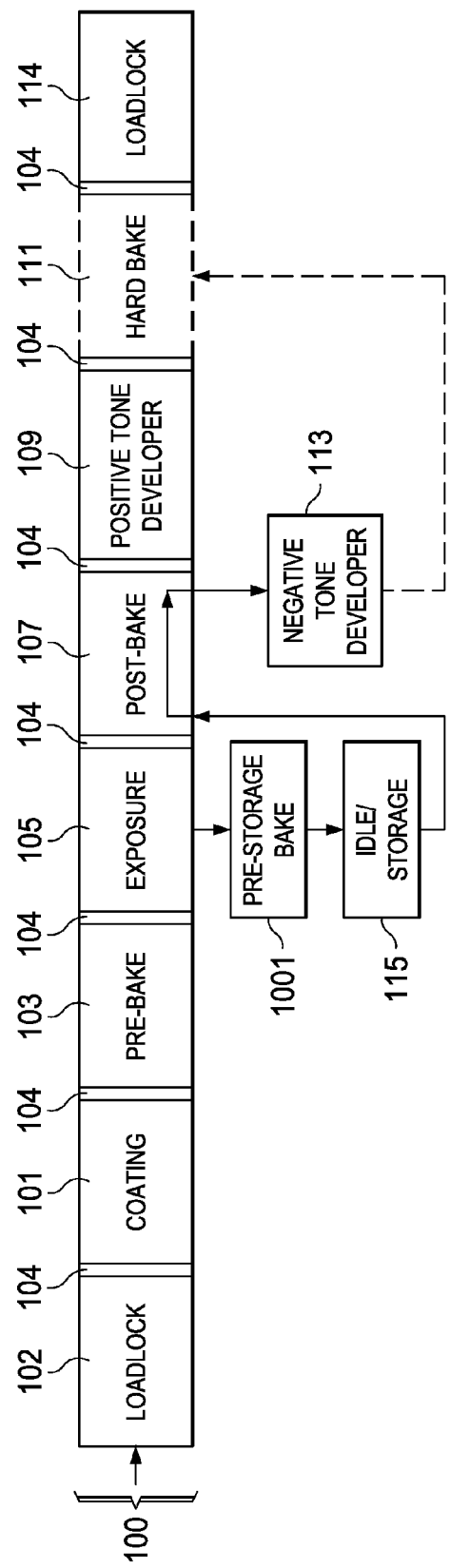
FIG. 10 illustrates a two bake process with an idle between the bake processes in accordance with an embodiment.

FIG. 10 illustrates yet another embodiment which may be used to protect the photoresist 211 during the idle period. In this embodiment a pre-storage bake 1001 is performed before the substrate 201 and the photoresist 211 are put into the idle/storage unit 115. In this embodiment the pre-storage bake 1001 will generate a little more acid than the exposure process, but not as much as the first PEB 501. This acid will activate a part of the acid leaving group/group which will decompose on the hydrocarbon structure of the polymers within the polymer resin. Additionally, the acids generated by the pre-storage bake 1001 will react with any quenching chemicals, PDBs, or bases that might diffuse into and contaminate the photoresist 211 from the surrounding environment while the photoresist 211 is in the idle/storage unit 115. As such, the effects of these contaminants may be reduced or eliminated.

In an embodiment the pre-storage bake 1001 may be performed either in the post-bake station 107, in another heating station of the first photoresist track system 100 (e.g., the pre-bake station 103), or else the substrate 201 and the photoresist 211 may be removed from the first photoresist track system 100 and an external, offline heating unit may be utilized. The pre-storage bake 1001 may be performed at a temperature of between about 30° C. and about 100° C. and may be performed for a time period of about 10 seconds to about 300 seconds.

Once the pre-storage bake 1001 has been performed and the substrate 201 and the photoresist 211 have been idled, the substrate 201 and the photoresist 211 may be transferred to the post-bake station 107 and the first PEB 501 may be performed. After the first PEB 501 is completed, the substrate 201 and the photoresist 211 may be removed from the first photoresist track system 100 and developed in the off-line negative tone developer station 113.

After the photoresist 211 has been developed by the negative tone developer station 113 and the photoresist 211 is ready to serve as a mask for additional processing of the layer to be patterned, the additional processing may be performed on the layer to be patterned 209 while the photoresist 211 is in place. As one example, a reactive ion etch or other etching process may be utilized, to transfer the pattern of the photoresist 211 to the underlying layer to be patterned 209. Alternatively, in an embodiment in which the layer to be patterned 209 is a seed layer, the layer to be patterned 209 may be plated in order to form, e.g., a copper pillar, or other conductive structure in the opening of the photoresist 211. Any suitable processing, whether additive or subtractive, that may be performed while the photoresist 211 is in place may be performed, and all such additional processing are fully intended to be included within the scope of the embodiments.

Alternatively, in attempting to control the diffusion of the strong acid using temperature and time (as described above), an alternative method of control may be to use a polymer bound photoacid generator (PBP) instead of a stand-alone photoacid generator. In this embodiment the bonding of the photoacid generator to the polymers within the polymer resin will limit the diffusion of the strong acid by forming the strong acid in very close proximity to the polymer to which it can react. As such, the strong acids generated will react before the strong acids have a chance to diffuse.

The structure of such a PBP depends at least in part upon the wavelength of energy (e.g., light) which the PBP will absorb to initiate the formation of the strong acid. However, in an embodiment in which the photoresist 211 will be exposed with a ArF excimer laser to absorb 193 nm wavelength of light, the PBP may have the following structure:

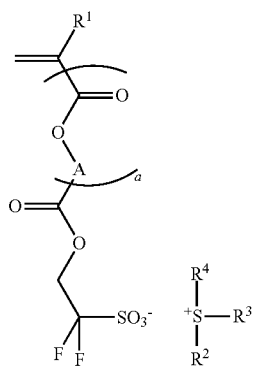

where $R^1$ is a hydrogen atom, a fluorine atom, a methyl group, or a trifluormethyl group; $R^2$, $R^3$, $R^4$ comprise 1 to 10 carbon atoms in an alkyl group, an alkenyl group, or an oxoalkyl group, comprise 6 to 18 carbon atoms in an aryl group, an aralkyl group, or an aryloxoalkyl group; A comprises 2 to 20 carbon atoms having a cyclic structure and may comprise a heteroatom; and n is either 0 or 1. Additionally, two of $R^2$, $R^3$, $R^4$ may bond together to form a ring with S.

In an alternative embodiment the photoresist 211 may be exposed using a KrF excimer laser, which emits light at a wavelength of 248 nm. In this embodiment the PBP may have the following structures:

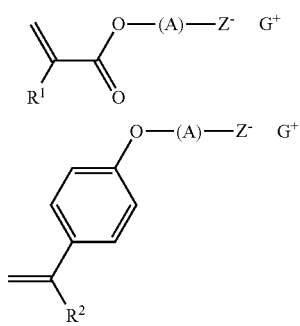

where $R^1$ and $R^2$ are a hydrogen atom, a fluorine atom, comprise 1 to 6 carbon atoms in a alkyl group or fluoroalkyl group; A is a fluorine-substituted alkylene group with 1 to 30 carbon atoms, a fluorine-substituted cycloalkylene group with 3 to 30 carbon atoms, a fluorine-substituted arylene group with 6 to 30 carbon atoms, a fluorine-substituted alkylene arylene group with 7 to 30 carbon atoms; Z is an anionic group comprising a sulfonate; and G is a photo-decomposed cation group.

Additionally, as one of ordinary skill in the art will recognize, while the PBPs discussed above with respect to the ArF excimer laser and the KrF excimer laser may be used, the precise PBPs described are only intended to be illustrative and are not intended to be limiting upon the embodiments. Rather, any suitable structure that may be a photoacid generator and also be bound to the polymer within the polymer resin may alternatively. All such structures are fully intended to be included within the scope of the embodiments.

Alternatively, instead of bonding the photoacid generator to the polymer, an elevated energy activity acid labile group, such as a medium or high energy activity acid labile group, may be used. While low energy activity acid labile groups may deprotect at room temperatures, by using such a high energy activity acid labile group, the deprotection rate of the polymers in the polymer resin at, e.g., room temperature, may be reduced. By reducing the deprotection rate, the reaction of the strong acid in those regions into which it has already diffused can be reduced, minimizing its effects.

In an embodiment the high energy activity acid labile group may have the following structures:

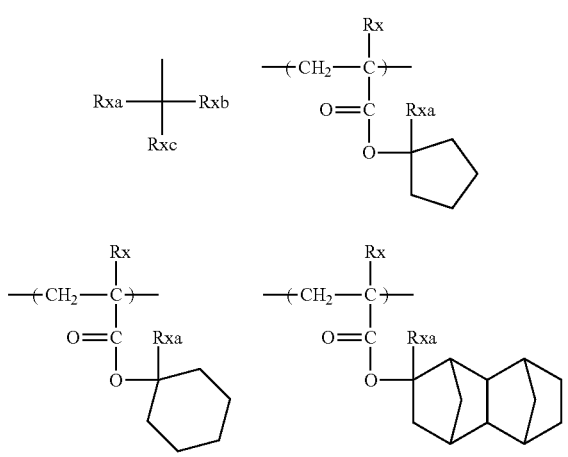

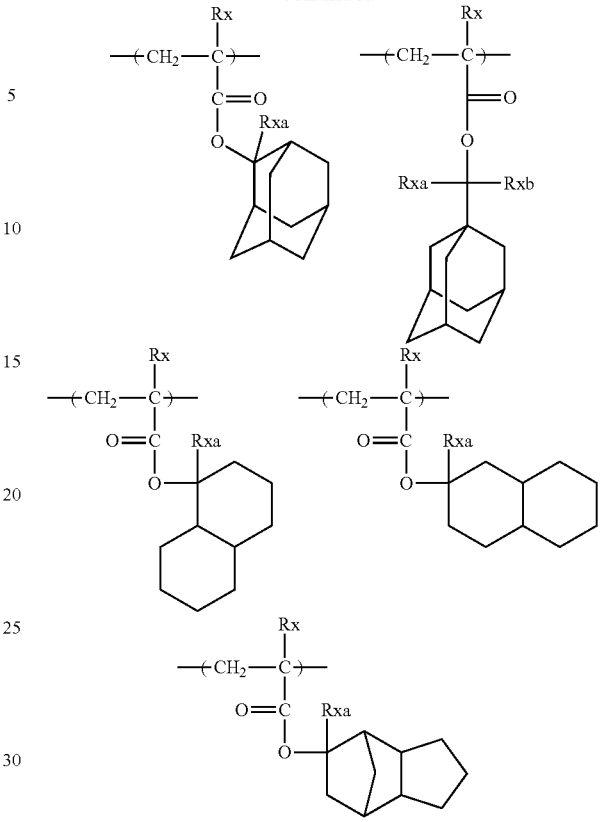

where Rx represents a hydrogen atom, a methyl group or a hydroxymethyl group and Rxa, Rxb and Rxc independently represent an alkyl group, wherein at least one of Rxa, Rxb, and Rxc has no greater than 1 to 3 carbon atoms in a linear chain with no branches.

By limiting at least one of the groups to a linear chain with no branches, the energy activity of the acid labile group will remain elevated. For example, because the alkyl group is an electron donating group and the chemically amplified reaction (CAR) is a substitution nucleophilic 1 ($S_N1$) reaction, the presence of too many branches in the alkyl group will let the energy activity decrease. However, if at least one of Rxa, Rxb, and Rxc have 1 to 3 carbon atoms in a linear chain with no branches, the energy activity will remain elevated, and deprotection of the acid labile group at room temperature can be reduced or eliminated.

Additionally, as one of ordinary skill in the art will recognize, while the medium or high energy activity acid labile groups described above may be used, these specific examples are only intended to be illustrative and are not intended to be limiting upon the embodiments. Rather, any other suitable group may alternatively be used. All such groups are fully intended to be included within the scope of the embodiments.

In accordance with an embodiment, a method of manufacturing a semiconductor device comprising exposing a photoresist on a substrate, the exposing the photoresist being performed in a photoresist track system, is provided. The photoresist is removed from the photoresist track system and the photoresist is developed in an offline developing system, the developing the photoresist being performed at least in part with a negative tone developer.

In accordance with another embodiment, a method of manufacturing a semiconductor device comprising exposing a photoresist in an exposure station of a photoresist track system and idling the photoresist for a first time period is provided. After the idling the photoresist, the photoresist is developed with a negative tone developer in a negative tone developing station, the negative tone developing station being separate from the photoresist track system.

In accordance with yet another embodiment, a photoresist polymer resin comprising a repeating unit and a polymer bound photoacid generator is provided.

In accordance with yet another embodiment, a photoresist polymer comprising a skeletal backbone and a high energy activity acid labile group is provided.

Although the present embodiments and their advantages have been described in detail, it should be understood that various changes, substitutions and alterations can be made herein without departing from the spirit and scope of the disclosure as defined by the appended claims. For example, many different processes may be utilized to form, apply, and develop the photoresist.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
    exposing a photoresist on a substrate, the exposing the photoresist being performed in a photoresist track system;
    removing the photoresist from the photoresist track system; and
    developing the photoresist in an offline developing system, the developing the photoresist being performed at least in part with a negative tone developer.

2. The method of claim 1, wherein the photoresist track system further comprises a positive tone development station.

3. The method of claim 1, further comprising idling the substrate after the exposing the photoresist and prior to the developing the photoresist.

4. The method of claim 3, further comprising performing a first bake performed after the exposing the photoresist and prior to the developing the photoresist.

5. The method of claim 4, wherein the idling occurs after the first bake.

6. The method of claim 4, wherein the idling occurs before the first bake.

7. The method of claim 4, further comprising performing a second bake separate from the first bake, the performing the second bake occurring after the exposing the photoresist and prior to the developing the photoresist, the idling occurring after the performing the first bake and before the performing the second bake.

8. The method of claim 7, wherein the first bake is a post-exposure baking process.

9. The method of claim 7, wherein the second bake is a post-exposure baking process.

10. A method of manufacturing a semiconductor device, the method comprising:
    exposing a photoresist in an exposure station of a photoresist track system;
    idling the photoresist for a first time period; and
    after the idling the photoresist, developing the photoresist with a negative tone developer in a negative tone developing station, the negative tone developing station being separate from the photoresist track system.

11. The method of claim 10, further comprising performing a post-exposure baking of the photoresist after the idling the photoresist.

12. The method of claim 10, further comprising performing a post-exposure baking of the photoresist before the idling the photoresist.

13. The method of claim 10, further comprising:
    performing a post-exposure baking prior to the idling the photoresist; and
    performing a diffusion baking after the idling the photoresist.

14. The method of claim 10, further comprising:
    performing a pre-idling baking prior to the idling the photoresist; and
    performing a post-exposure baking after the idling the photoresist.

15. A method of manufacturing a semiconductor device, the method comprising:
    placing a substrate into a photoresist track system;
    applying a photoresist onto the substrate within the photoresist track system;
    exposing the photoresist within the photoresist track system;
    removing the substrate from the photoresist track system after the exposing the photoresist; and
    developing the photoresist away from the photoresist track system after the removing the substrate from the photoresist track system, wherein the developing the photoresist is performed at least in part with a negative tone developer.

16. The method of claim 15, wherein the photoresist track system further comprises a positive tone development station.

17. The method of claim 15, further comprising idling the substrate after the exposing the photoresist and prior to the developing the photoresist.

18. The method of claim 17, wherein the idling occurs after a baking of the photoresist, wherein the baking of the photoresist is performed after the exposing the photoresist.

19. The method of claim 18, further comprising performing a diffusion baking process after the idling the substrate.

20. The method of claim 15, further comprising returning the substrate to the photoresist track system.

* * * * *